US012645103B1

(12) United States Patent
Jiang et al.

(10) Patent No.: US 12,645,103 B1
(45) Date of Patent: Jun. 2, 2026

(54) WIDE BANDGAP OPTICAL PHASED ARRAYS (OPA'S) AND METHODS RELATED THERETO

(71) Applicant: Texas Tech University System, Lubbock, TX (US)

(72) Inventors: Hongxing Jiang, Lubbock, TX (US); Changzhi Li, Lubbock, TX (US); Jing Li, Lubbock, TX (US); Jingyu Lin, Lubbock, TX (US); Aaron Carman, Lubbock, TX (US); Trey Smith, Amarillo, TX (US)

(73) Assignee: Texas Tech University System, Lubbock, TX (US)

( * ) Notice: Subject to any disclaimer, the term of this patent is extended or adjusted under 35 U.S.C. 154(b) by 464 days.

(21) Appl. No.: 18/297,537

(22) Filed: Apr. 7, 2023

Related U.S. Application Data

(63) Continuation-in-part of application No. 17/896,303, filed on Aug. 26, 2022, now Pat. No. 11,747,658,
(Continued)

(51) Int. Cl.
*G02F 1/017* (2006.01)
*G02F 1/29* (2006.01)
(Continued)

(52) U.S. Cl.
CPC .............. *G02F 1/017* (2013.01); *G02F 1/292* (2013.01); *H01S 3/0085* (2013.01);
(Continued)

(58) Field of Classification Search
CPC .. G02F 1/017; G02F 1/01716; G02F 1/01733; G02F 1/01766; G02F 1/292;
(Continued)

(56) References Cited

U.S. PATENT DOCUMENTS 5,488,504 A 1/1996 Worchesky et al.
9,047,818 B1 6/2015 Day et al.
(Continued)

FOREIGN PATENT DOCUMENTS

JP 2006135001 A 5/2006

OTHER PUBLICATIONS

H. Zheng et al. "Engineered ultraviolet InGaN/AlGaN multiple-quantum-well structures for maximizing cathodoluminescence efficiency" AIP Advances 12, 015005 (2022); doi: 10.1063/6.0001262 (Year: 2022).*
(Continued)

*Primary Examiner* — Marin Pichler
(74) *Attorney, Agent, or Firm* — Dickinson Wright PLLC; Ross Spencer Garsson

(57) ABSTRACT

Disclosed is a system and method for solid-state 2D optical phased arrays (OPAs), which are fabricated from InGaN/AlGaN multiple quantum wells (MQWs) and AlyGa1-yN/AlxGa1-xN (y<x) MQWs. The InGaN/AlGaN MQWs and AlyGa1-yN/AlxGa1-xN (y<x) MQWs include alternating p-type and n-type layers to form p-n-p-n MQW structures to allow the OPA to operate in the reversed biased configuration to further minimize the operating current and heat generation. The phase in each pixel within the OPA will be controlled independently via electro-optic effect in III-nitride MQWs by varying the voltage in each pixel by a Si CMOS array to achieve the manipulation of the distribution of optical power in the far field and steering of the main laser beam. The present disclosure is applicable to a wide range of applications, including the operation of LIDAR systems, laser weapons, laser illuminators, and laser imaging systems.

24 Claims, 19 Drawing Sheets

Related U.S. Application Data which is a continuation of application No. 16/703,496, filed on Dec. 4, 2019, now Pat. No. 11,460,723.

(60) Provisional application No. 62/774,942, filed on Dec. 4, 2018.

(51) Int. Cl.

| | |
|---|---|
| *H01L 27/15* | (2006.01) |
| *H01S 3/00* | (2006.01) |
| *H10H 29/14* | (2025.01) |

(52) U.S. Cl.
CPC ....... *H10H 29/142* (2025.01); *G02F 2202/10* (2013.01); *G02F 2202/36* (2013.01); *G02F 2203/50* (2013.01)

(58) Field of Classification Search
CPC .... G02F 1/29; G02F 2202/10; G02F 2202/36; G02F 2203/50; H01S 3/0085
USPC ................................................... 359/279, 11
See application file for complete search history.

(56) References Cited

U.S. PATENT DOCUMENTS

| | | | |
|---|---|---|---|
| 9,477,101 | B2 | 10/2016 | Han et al. |
| 11,460,723 | B1 | 10/2022 | Jiang et al. |
| 2005/0100069 | A1 | 5/2005 | Gwo |
| 2019/0386173 | A1* | 12/2019 | Chen .................... H10H 20/812 |
| 2022/0404647 | A1 | 12/2022 | Jiang et al. |

OTHER PUBLICATIONS

Albota, M., et al., "Three-Dimensional Imaging Laser Radars with Geiger-Mode Avalanche Photodiode Arrays", Lincoln Laboratory Journal, vol. 13, 2002, pp. 351-370.

Bulutay, C., et al., "Carrier-Induced Refractive Index Change and Optical Absorption in Wurtzite InN and GaN: Full-Band Approach", Physical Review B, vol. 81, 2010, pp. 155206-1 to 152206-10.

Day, J., et al., "III-Nitride Full-Scale High-Resolution Microdisplays", Applied Physics Letters, vol. 99, 2011, 4 pages.

Kneissl, M., et al., "InGaN MOW laser diode with integrated intracavity electroabsorption modulator," IEEE 18th International Semiconductor Laser Conference, 2002, pp. 125-126, doi: 10.1109/ISLC.2002.1041149. (Year: 2002).

Komar, A., et al., "Electrically Tunable All-Dielectric Optical Metasurfaces Based on Liquid Crystals", Applied Physical Letters, vol. 110, 2017, 5 pages.

Kwong, D., et al., "1x12 Unequally Spaced Waveguide Array for Actively Tuned Optical Phased Array on a Silicon Nanomembrane", Applied Physical Letters, vol. 99, 2011, 4 pages.

Lalonde, J., et al., "Natural Terrain Classification Using Three-Dimensional Ladar Data for Ground Robot Mobility", Journal of Field Robotics vol. 23, 2006, pp. 839-861.

Levinson, J., et al., "Towards Fully Autonomous Driving: Systems and Algorightms", Intelligent Vehicles Symposium (IV), 2011 IEEE, pp. 163-168.

Lin, J., et al., "High-Resolution Group III Nitride Microdisplays", The International Society for Optics and Photonics, Dec. 14, 2011, 4 pages.

Lin, Y., et al., "Mini-UAV-Borne LIDAR for Fine-Scale Mapping", IEEE Geoscience and Remote Sensing Letters, vol. 8, May 2011, pp. 426-430.

Mansell, J., et al., "Advanced Deformable Mirros for High-Power Lasers", Proceedings of SPIE, vol. 9083, 2014, 13 pages.

McManamon, P., et al., "Optical Phased Array Technology", Proceedings of the IEEE, vol. 84, Feb. 1996, pp. 268-298.

Orsal, G., et al., "Bandgap Energy Bowing Parameter of Strained and Relaxed InGaN Layers", Optical Materials Express, vol. 4, May 1, 2014, pp. 1030-1041.

Phare, C., et al., "Silicon Optical Phased Array with High-Efficiency Beam Formation over 180 Degree Field of View", 2018, 12 pages.

Poulton, C., et al., "Coherent Solid-State LIDAR with Silicon Photonic Optical Phased Arrays", Optic Letters, Oct. 15, 2017, vol. 42, pp. 4091-4094.

Resler, D., et al., "High-Efficiency Liquid-Crystal Optical Phased-Array Beam Steering", Optics Letters, vol. 21, May 1, 1996, pp. 689-691.

Schween, J., et al., "Mixing-Layer Height Retrieval with Ceilometer and Doppler Lidar: From Case Studies to Long-Term Assessment", Atmospheric Measurement Techniques, vol. 7, 2014, pp. 3685-3704.

Serati, S., et al., "Advanced Liquid Crystal on Silicon Optical Phased Arrays", IEEE Aerospace Conference 7, 2002, pp. 3-1395 to 3-1402.

Sirkeli, V., et al. "Efficiency enhancement of InGaN/GaN light-emitting diodes with pin-doped GaN quantum barrier", IOPscience, 2017 J. Phys. D: Appl. Phys. 50 035108 (Year: 2017).

Sun, J., et al., "Large-scale Nanophotonic Phased Array", Nature, Jan. 10, 2013, vol. 493, pp. 195-199.

Van Acoleyen, K., et al., "Off-Chip Beam Steering with a One-Dimensional Optical Phased Array on Silicon-On-Insulator", Optics Letter, vol. 34, May 1, 2009, pp. 1477-1479.

Wikipedia, "Deformable Mirror", https://en.wikipedia.org/wiki/Deformable_mirror, 4 pages.

Yu, J., et al. "Resonant cavity enhanced InGaN/GaN multiple quantum well solar cells," 2016, IEEE 5th International Symposium on Next-Generation Electronics (ISN E), 2016, pp. 1-2, doi: 10.1109/ISN E.2016.7543321. (Year: 2016).

* cited by examiner

DBR layer structure

Bandwidth: $\Delta\lambda_0 = 82$ nm 40 pair AlN/Al$_{0.5}$Ga$_{0.5}$N DBR

Basic condition:

$$\lambda/4 = n_1 * d_1 = n_2 * d_2$$

Reflectivity:

$$R = \left[ \frac{n_0(n_2)^{2N} - n_S(n_1)^{2N}}{n_0(n_2)^{2N} + n_S(n_1)^{2N}} \right]^2$$

Bandwidth:

$$\Delta\lambda_0 = \frac{4\lambda_0}{\pi} \arcsin\left( \frac{n_2 - n_1}{n_2 + n_1} \right)$$

$n_0 = 1$ (air)
$n_1 = 2.07$ (AlN)
$n_2 = 2.25$ (Al$_{0.5}$Ga$_{0.5}$N)
$n_S = 2.35$ (GaN)
$\lambda = 1550$ nm

| $\lambda$ (nm) | n | d (nm) |
|---|---|---|
| 1550 | 2.07 | 187 |
| 1550 | 2.25 | 172 |

Pitch=1.5λ
10x10 array

Pitch=5λ
10x10 array

Pitch=1λ
10x10 array

Pitch=2.5λ
10x10 array

Pitch=2λ
10x10 array

2-D array simulation

θ = 0~π

Pitch

WIDE BANDGAP OPTICAL PHASED ARRAYS (OPA'S) AND METHODS RELATED THERETO

CROSS-REFERENCE TO RELATED APPLICATIONS

This application is a continuation-in-part application of and claims priority and benefit to U.S. patent application Ser. No. 17/896,303, filed on Aug. 26, 2022, entitled "Semiconductor Optical Phased Arrays (OPA's) And Methods Related Thereto," which claims priority and benefit to U.S. patent application Ser. No. 16/703,496 filed on Dec. 4, 2019, entitled "Semiconductor Optical Phased Arrays (OPA's) And Methods Related Thereto," which claims priority to U.S. Patent Application Ser. No. 62/774,942, filed Dec. 4, 2018, entitled "Semiconductor Optical Phased Arrays (OPAs)". The foregoing applications are hereby incorporated herein by reference in its entirety for all purposes.

STATEMENT OF FEDERALLY FUNDED RESEARCH

This disclosure is related to federally sponsored research and development under contract number FA9451-19-C-0020. The disclosure was made with U.S. government support. The U.S. government has certain rights in the disclosure.

TECHNICAL FIELD

The present disclosure relates to an optical phased array and more specifically to solid-state optical phased arrays based on InGaN/GaN multiple quantum wells and a method of fabricating InGaN/GaN multiple quantum well optical phased arrays with the capabilities to steer, correct phase aberrations, and combining laser beams by directly controlling the beam front. The disclosed systems and methods support a wide variety of scenarios and includes various products and services.

BACKGROUND OF THE DISCLOSURE

Electromagnetic phased arrays [1] operating in the microwave electromagnetic spectral region are widely deployed in modern devices, including wireless systems to transmit and receive secure information, military and navigation radar, broadcasting and astronomy, and autonomous vehicles. One of the main functions of a phased array is to precisely steer a beam of electromagnetic waves without using any moving parts.

The ability to precisely steer and point incoming or outgoing laser beams without moving parts can be useful to the operation of military laser weapons, laser illuminators, and laser imaging systems. Presently, however, solid-state 2D optical phased arrays (OPA) lack the capabilities needed to directly control the phase of a main laser beam.

Optical phased arrays (OPAs) are the counterpart of microwave phased arrays by transposing the technique to the optical regime. OPAs are expected to possess the ability to precisely steer, point, and correct the phase of incoming or outgoing laser light. This ability is crucial to a wide range of applications, including the operation of LIDAR systems, laser weapons, laser illuminators, and laser imaging systems. Due to the fact that optical wavelengths are much shorter than those of microwaves, OPAs afford smaller diffraction angles in LIDAR systems for a given aperture size than microwave-based radar systems and hence will be extremely useful in autonomous vehicles, robotics, aerial mapping, and atmospheric measurements [2-8]. Moreover, two dimensional (2D) OPAs with abilities to steer and correct phase aberrations due to atmospheric turbulence and aero-optical turbulence by directly controlling the laser beam front are highly desired for applications in military vehicles, ships, and aircraft systems. However, currently there are no valid approach for obtaining compact and robust 2D OPAs.

A fully functional OPA must have a periodicity near half of the wavelength. Because the optical wavelengths are much shorter than those of microwaves, the half-wavelength requirement brings out technical challenges on device fabrication. As a consequence, although optical phased arrays have been investigated in various platforms, including deformable mirrors which contain moving parts and are very bulky [9, 10] and liquid crystal OPAs which are solid-state [11-14]. Recent demonstrations of OPAs using semiconductor materials and photonic structures have been limited to one-dimensional (1D) [15-17]. A recently demonstrated relatively large-scale two-dimensional nanophotonic phased array (NPA) lacks the ability to steer and correct phase aberrations by directly controlling the beam front [2]. Accordingly, a need remains in the art for solid-state two-dimensional (2D) optical phased arrays.

SUMMARY OF THE DISCLOSURE

The present disclosure relates to the design and fabrication of solid-state 2D optical phased arrays (OPAs) operating in the spectral region of $\lambda$=1.5 $\mu$m, as illustrated in FIG. 1A. These OPAs are fabricated from In-rich $In_{1-x}Ga_xN$/GaN multiple quantum wells (MQWs) with a Ga composition at around x~0.05. The principle of operation is based on two facts (1) the bandgap of $In_{1-x}Ga_xN$ alloys can be adjusted and more specifically $In_{1-x}Ga_xN$ (x~0.05) has an energy band gap of $E_g{\approx}hv$ (1.5 $\mu$m) [19]; and (2) In-rich $In_xGa_{1-x}N$ alloys possess the unique properties of exceptionally high free-carrier-induced refractive index (n) change and low optical loss [20]. For instance, at 1.5 $\mu$m, an increase in the concentrations of free electrons and holes by $5{\times}10^{18}$ $cm^{-3}$ produces more than 4% change in n, corresponding to a change in the refractive index of $\Delta n$=0.11 [20].

Further, the present disclosure relates to adopting a heterogeneous integration approach for integration III-nitride microLED array and Si CMOS IC to drive individual pixels [24-26] for realizing III-nitride microLED microdisplays. As such, in the present disclosure, the phase of each pixel in the OPA can be controlled independently via electro-optic effect through the integration between OPA pixels with a Laterally Diffused MOSFET (LDMOS) IC driver to achieve the manipulation of the distribution of optical power in the far field. In some embodiments, based on the counterbalance between the quantum confinement effect, quantum Stark effect, and band filling in InGaN/GaN MQW, a fraction of the incoming 1.5 $\mu$m laser beam (<2%) can be utilized to produce a sustainable free carrier concentration under an applied E field and a reduction in the refractive index of $In_{1-x}Ga_xN$ wells at 1.5 $\mu$m. Accordingly, the present disclosure can enable the phase control of the laser beam [20].

As illustrated in FIG. 1B, effectively, InGaN/GaN MQW pixels play the role of using a very small fraction of the laser beam (less than 2%) to modulate the phase of the laser beam. The phase of each pixel in the OPA will be controlled independently via electro-optic effect through the integration between OPA pixels with a Laterally Diffused MOSFET (LDMOS) IC driver to achieve the manipulation of the distribution of optical power in the far field. In other words, owing to the counterbalance between the quantum confinement effect, quantum Stark effect, and band filling in InGaN/GaN MQW, a small fraction of the incoming 1.5 μm laser beam (<2%) can be utilized to produce a sustainable free carrier concentration under an applied E field and a reduction in the refractive index of $In_{1-x}Ga_xN$ wells at 1.5 μm. This enables the phase control of the laser beam. It can be seen from FIG. 2 and FIG. 3 that in the absence of an applied electric field (E=0), photon absorption at 1.5 μm within $In_{1-x}Ga_xN$ MQW (x~0.05) is negligibly small since the apparent energy bandgap of the MQW is slightly higher than the energy of the laser beam and 86% of laser beam is reflected back, whereas 86% reflectivity of OPA (or the filling factor of OPA) is calculated by knowing that the pixel size is 0.7 μm, pixel pitch is 0.75 μm, and the reflectivity of the back reflective mirror is 99%, which gives (0.7 μm/0.75 μm) 2-1% (mirror)=86%; (2) at $E=E_o/2$, 1% of laser beam is absorbed by MQW and 85% of laser beam is reflected back; (3) at $E=E_o$, 2% of laser beam is absorbed by MQW and 84% of laser beam is reflected back. By designing the InGaN well width to be about 10 nm and a GaN barrier width to be 2.5 nm and the total number of periods of MQWs to be about 360, one obtains a total active layer thickness (wells) of $L_w$~3.6 μm, and a total thickness of MQWs (wells+barriers) of L~4.5 μm. This supports a change in the optical path length in each pixel up to $\Delta L=2L_w$(InGaN) $\Delta n=2\times3.6$ μm×0.11=0.79 μm, where Δn is the change in the refractive index due to change in the carrier concentrations in each pixel. This provides an ability of phase control in each pixel from 0 to greater than π (=2π×0.79 μm/1.5 μm=1.05 π) with the aid of a controllable electric field E via an LDMOS IC driver.

The OPA of the present disclosure has the capability of mitigating atmospheric turbulence and aero-optical turbulence as well as of beam steering by directly controlling the phase of individual pixels via electro-optic effect, as taught conceptually by FIGS. 1-3. An OPA with a pixel pitch of 2/2 (=0.75 μm) can operate at 1.5 μm and is capable of continuous active phase shifting from 0 to 1. By reducing the pixel pitch, the OPA of the present disclosure can be made to function in the visible spectral range.

One embodiment of the present disclosure provides a method for fabricating OPAs by providing InGaN/GaN MQWs with a total active layer thickness (wells) of $L_w$, a total barrier thickness of $L_b$ and a period of N. The total thickness of $L_w$ within the MQW structure is sufficiently large such that the reflected laser beam from OPA is subjected to optical path variations in each pixels, leading to a phase control in each pixels from 0 to greater than 1. InGaN/GaN MQWs are produced by epitaxial growth methods such as metal organic chemical vapor deposition (MOCVD), molecular beam epitaxy (MBE), and hydride vapor phase epitaxy (HVPE).

Another embodiment of the present disclosure provides a method for defining pixels on InGaN/GaN MQWs. Pixel array are defined by nanofabrication techniques such as electron-beam (e-beam) lithography together with dry etching techniques, or extreme UV (EUV) optical lithography together with dry etching techniques, or by focused ion beam (FIB) etching.

Another embodiment of the present disclosure provides a method for fabricating LDMOS IC driver chip, which is designed and fabricated to allow the integration of 50 V devices on chip, and flip-chip bonded with pixel array.

The present disclosure provides a method to actively control the phase of each pixels in OPA via electro-optic effect through the integration between OPA pixels with an LDMOS IC driver chip. The phase of each pixel will be controlled independently via electro-optic effect through the integration between OPA pixels with a LDMOS IC driver to achieve the manipulation of the distribution of optical power in the far field. The integration between LDMOS IC driver and OPA pixel array is accomplished by flip-chip bonding using indium bumps.

It is therefore an object of the present disclosure to provide a A solid-state 2D optical phased array (OPA), comprising: $In_{1-x}Ga_xN$/GaN multiple quantum wells (MQWs) having a Ga composition at around x~0.05, each MQW comprising an MQW pixel, wherein each MQW pixel utilizes a limited fraction of a laser beam; an independent laterally diffused MOSFET (LDMOS) integrated circuit (IC) driver to independently control each MQW pixel to achieve manipulation of a distribution of optical power in a far field; wherein the OPA operates in a spectral region of around λ=1.5 μm and utilizes said limited fraction of a laser beam to modulate a phase of the laser beam.

In one aspect each MQW comprises an InGaN well width of about 10 nanometers (nm), and the limited fraction of a laser beam includes a fraction of the laser beam that is less than or equal to 2% of the laser beam.

In another aspect each MQW comprises a GaN barrier width of about 2.5 nm. In yet another aspect the total number of periods of MQWs is about 360. In one aspect, the present disclosure comprises a total active layer thickness (wells) of $L_w$, and a total barrier thickness of $L_b$ and a period of N. In one aspect the total active layer thickness of the MQW, including the wells and barriers, is $L_w$~3.6 μm.

In another aspect of the present disclosure, each MQW pixel is capable of changing the optical path length to provide phase control of each pixel from 0 to 1.05π. The utilization of said limited fraction of a laser beam is less than 2%. The OPA phase is controlled by directly controlling the phase of each MQW pixel using an electro-optic effect to effect MQW pixel pitch. In one aspect the OPA phase is controlled by a computing device connected to the OPA via a network.

It is another object of the present disclosure to provide a method of fabricating a solid-state 2D optical phased array (OPA), comprising: producing InGaN/GaN multiple quantum wells (MQWs) with a total active layer thickness (wells) of $L_w$, and a total barrier thickness of $L_b$; forming an MQW pixel array by defining MQW pixels on the InGaN/GaN MQWs wherein each MQW pixel is sufficiently large that a laser beam reflected from the OPA is capable of being subjected to an optical path variation in the each MQW pixel, leading to a phase control in the each MQW pixel from 0 to greater than π; and integrating an independent laterally diffused MOSFET (LDMOS) integrated circuit (IC) driver to independently control the each MQW pixel to achieve manipulation of the distribution of optical power in the far field, wherein the OPA is fabricated to operate in the spectral region of around λ=1.5 μm and utilize a limited fraction of a laser beam to modulate the phase of the laser beam. In one aspect the InGaN/GaN MQWs comprise $In_{1-x}Ga_xN$/GaN multiple quantum wells having a Ga composition at around x~0.05 produced by epitaxial growth methods selected from a group consisting of: metal organic chemical vapor deposition (MOCVD), molecular beam epitaxy (MBE), hydride vapor phase epitaxy (HVPE); and combinations thereof, on double sided polished sapphire substrates.

In another aspect the pixel array are defined by nanofabrication techniques selected from a group consisting of: electron-beam (e-beam) lithography together with dry etching techniques, extreme UV (EUV) optical lithography together with dry etching techniques, by focused ion beam (FIB) etching, or combinations thereof. In yet another aspect the LDMOS IC driver chip is designed and fabricated to allow the integration of 50 V devices on chip, and flip-chip bonded with the MQW pixel array allowing for active control of the phase of each MQW pixel in the OPA via electro-optic effect through the integration between the MQW pixel and the LDMOS IC driver. The limited laser beam fraction of less than 2% of the laser power is sufficient to generate and uphold a sufficiently high carrier density in each MQW pixel to effectively change the refractive index of InGaN and subsequently cause a phase shift of laser beam in each MQW pixel of the OPA.

It is another object of the present disclosure to provide a system for solid-state 2D optical phased array (OPA)-based modulation of a laser beam, comprising: $In_{1-x}Ga_xN$/GaN multiple quantum wells (MQWs) having a Ga composition at around x~0.05, comprising an OPA, each MQW comprising an MQW pixel, wherein each MQW pixel utilizes a limited fraction of a laser beam; an independent laterally diffused MOSFET (LDMOS) integrated circuit (IC) driver to independently control each MQW pixel to achieve manipulation of the distribution of optical power in the far field, wherein each MQW pixel is capable of changing the optical path length to provide phase control of each pixel from 0 to $1.05\pi$, and wherein the OPAs operate in the spectral region of around $\lambda$=1.5 μm and utilize said limited fraction of a laser beam to modulate the phase of the laser beam. In one aspect the limited laser beam fraction used by the OPA is less than 2% of the laser power and is sufficient to generate and uphold a sufficiently high carrier density in each MQW pixel to effectively modulate the refractive index of InGaN and subsequently cause a phase shift of laser beam in each MQW pixel of the OPA. In another aspect the OPA phase is controlled by directly controlling the phase of each MQW pixel using an electro-optic effect to effect MQW pixel pitch.

In another aspect, the system of the present disclosure provides for the mitigation of atmospheric turbulence and aero-optical turbulence as well as of beam steering by directly controlling the phase of individual MQW pixels via electro-optic effect by continuous active phase shifting from 0 to $\pi$. The OPA can further be made to function in the visible spectral range by reducing the MQW pixel pitch. As with each embodiment presented herein, the system may be networked to a computing device networked via the LDMOS IC driver for controlling modulation of the MQW pixels.

The present disclosure of optical phased array offers advantages of phase tunability in each pixel, highly tolerant of phase errors and is expected to offer high temperature and high optical power handling capabilities due to the established ability to operate in high power/temperature environments and high thermal conductivity of III-nitride materials and devices.

BRIEF DESCRIPTION OF THE DRAWINGS

The foregoing and other objects, features, and advantages of the present disclosure will be apparent from the following description of embodiments as illustrated in the accompanying drawings, in which reference characters refer to the same parts throughout the various views. The drawings are not necessarily to scale, emphasis instead being placed upon illustrating principles of the present disclosure.

DETAILED DESCRIPTION OF THE DISCLOSURE

Figures 1A, 1B:
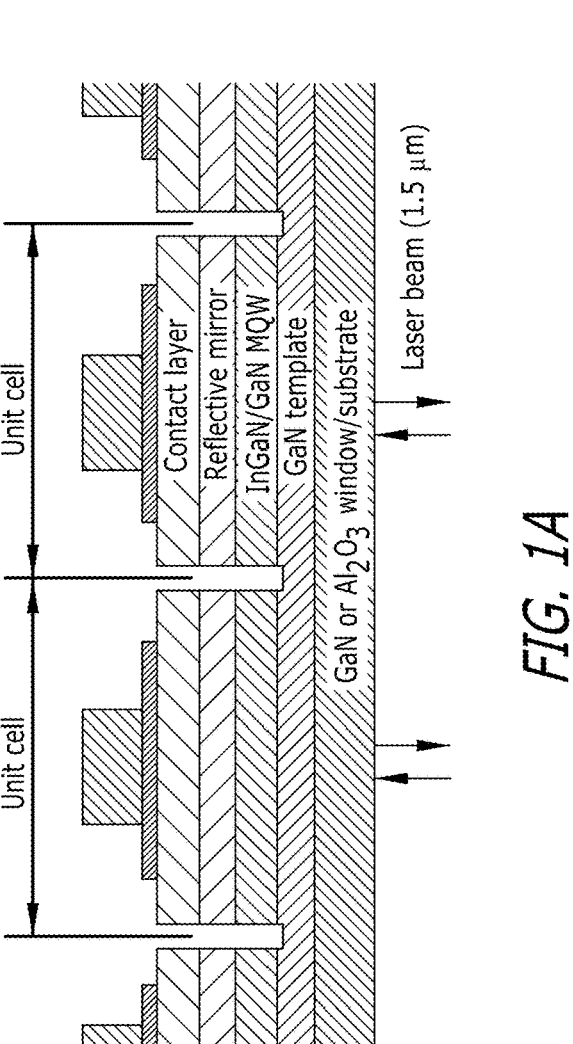
FIG. 1A depicts a schematic of a cross-sectional view of the reflective OPA based on InGaN/GaN MQW pixel array of the present disclosure.
FIG. 1B depicts a side view of an InGaN/GaN MQW OPA of the present disclosure.

While the making and using of various embodiments of the present disclosure are discussed in detail below, it should be appreciated that the present disclosure provides many applicable inventive concepts that can be embodied in a wide variety of specific contexts, goods, or services. The specific embodiments discussed herein are merely illustrative of specific ways to make and use the present disclosure and do not delimit the scope of the present disclosure.

All publications and patent applications mentioned in the specification are indicative of the level of skill of those skilled in the art to which the present disclosure pertains. All publications and patent applications are herein incorporated by reference to the same extent as if each individual publication or patent application was specifically and individually indicated to be incorporated by reference.

The present disclosure will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of the present disclosure the term "computing device" should be understood to refer to a processor which provides processing, database, and communication facilities. By way of example, and not limitation, a computing device can refer to a single, physical processor with associated communications and data storage and database facilities, or it can refer to a networked or clustered complex of processors and associated network and storage devices, including a software server, as well as operating software and one or more database systems and application software that support the services provided by the computing device. Computing devices may vary widely in configuration or capabilities, but generally a computing device may include one or more central processing units and memory. A computing device may also include one or more mass storage devices, one or more power supplies, one or more wired or wireless network interfaces, one or more input/output interfaces, or one or more operating systems, such as Windows Server, Mac OS X, Unix, Linux, FreeBSD, or the like.

For the purposes of the present disclosure a computer readable medium (or computer-readable storage medium/media) stores computer data, which data can include computer program code (or computer-executable instructions) that is executable by a computing device, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

For the purposes of the present disclosure a "network" should be understood to refer to a network that may couple devices so that communications may be exchanged, such as between a server and a client device or other types of devices, including between wireless devices coupled via a wireless network, for example. A network may also include mass storage, such as network attached storage (NAS), a storage area network (SAN), or other forms of computer or machine readable media, for example. A network may include the Internet, one or more local area networks (LANs), one or more wide area networks (WANs), wire-line type connections, wireless type connections, cellular or any combination thereof. Likewise, sub-networks, which may employ differing architectures or may be compliant or compatible with differing protocols, may interoperate within a larger network. Various types of devices may, for example, be made available to provide an interoperable capability for differing architectures or protocols. As one illustrative example, a router may provide a link between otherwise separate and independent LANs.

For purposes of the present disclosure, a "wireless network" should be understood to couple client devices with a network. A wireless network may employ stand-alone ad-hoc networks, mesh networks, Wireless LAN (WLAN) networks, cellular networks, or the like. A wireless network may further include a system of terminals, gateways, routers, or the like coupled by wireless radio links, or the like, which may move freely, randomly or organize themselves arbitrarily, such that network topology may change, at times even rapidly. A wireless network may further employ a plurality of network access technologies, including Long Term Evolution (LTE), WLAN, Wireless Router (WR) mesh, or 2nd, 3rd, or 4th generation (2G, 3G, or 4G) cellular technology, or the like. Network access technologies may enable wide area coverage for devices, such as client devices with varying degrees of mobility, for example.

For example, a network may enable RF or wireless type communication via one or more network access technologies, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), North American/CEPT frequencies, radio frequencies, single sideband, radiotelegraphy, radioteletype (RTTY), Bluetooth, 802.11b/g/n, or the like. A wireless network may include virtually any type of wireless communication mechanism by which signals may be communicated between devices, such as a client device or a computing device, between or within a network, or the like.

A computing device may be capable of sending or receiving signals, such as via a wired or wireless network, or may be capable of processing or storing signals, such as in memory as physical memory states, and may, therefore, operate as a server. Thus, devices capable of operating as a server may include, as examples, dedicated rack-mounted servers, desktop computers, laptop computers, set top boxes, integrated devices combining various features, such as two or more features of the foregoing devices, or the like. Servers may vary widely in configuration or capabilities, but generally a server may include one or more central processing units and memory. A server may also include one or more mass storage devices, one or more power supplies, one or more wired or wireless network interfaces, one or more input/output interfaces, or one or more operating systems, such as Windows Server, Mac OS X, Unix, Linux, FreeBSD, or the like.

For purposes of the present disclosure, a client (or consumer or user) device may include a computing device capable of sending or receiving signals, such as via a wired or a wireless network. A client device may, for example, include a desktop computer or a portable device, such as a cellular telephone, a smart phone, a display pager, a radio frequency (RF) device, an infrared (IR) device an Near Field Communication (NFC) device, a Personal Digital Assistant (PDA), a handheld computer, a tablet computer, a laptop computer, a set top box, a wearable computer, an integrated device combining various features, such as features of the forgoing devices, or the like.

A client device may vary in terms of capabilities or features. Claimed subject matter is intended to cover a wide range of potential variations. For example, a mobile device may include a numeric keypad or a display of limited functionality, such as a monochrome liquid crystal display (LCD) for displaying text. In contrast, however, as another example, a web-enabled client device may include one or more physical or virtual keyboards, mass storage, one or more accelerometers, one or more gyroscopes, global positioning system (GPS) or other location-identifying type capability, or a display with a high degree of functionality, such as a touch-sensitive color 2D or 3D display, for example.

The principles discussed herein may be embodied in many different forms. The preferred embodiments of the present disclosure will now be described where for completeness, reference should be made at least to the Figures.

Figure 2C:
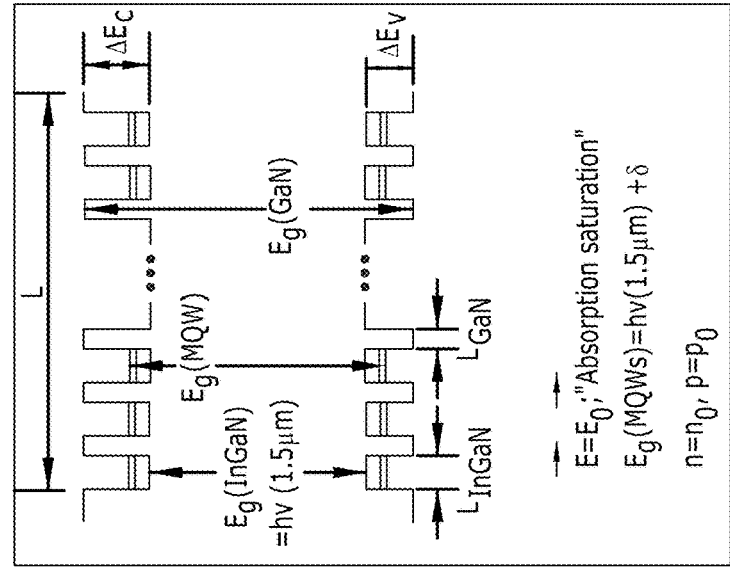
FIG. 2A-C depicts illustrations of carrier modulation via electro-optic effect in InGaN/GaN MQW and the counterbalance between the (A) quantum confinement effect, (B) quantum Stark effect, and (C) band filling in InGaN/GaN MQW to establish a sustainable carrier concentration as well as a reduction in the index of refraction and a phase shift at 1.5 μm. Due to the large values of the band offsets of the conduction band ($\Delta E_C$) and valence band ($\Delta E_V$) as well as a sufficiently large well width (~10 nm), the tunneling current in the MQW will be negligible.
Figure 2B:
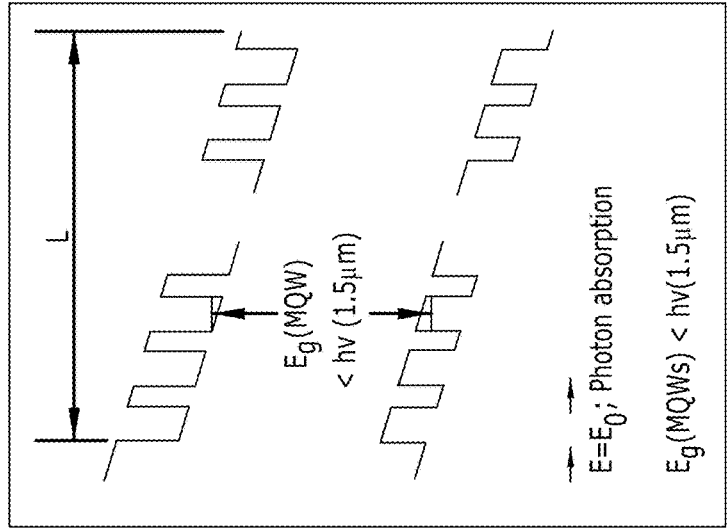
Figure 4:
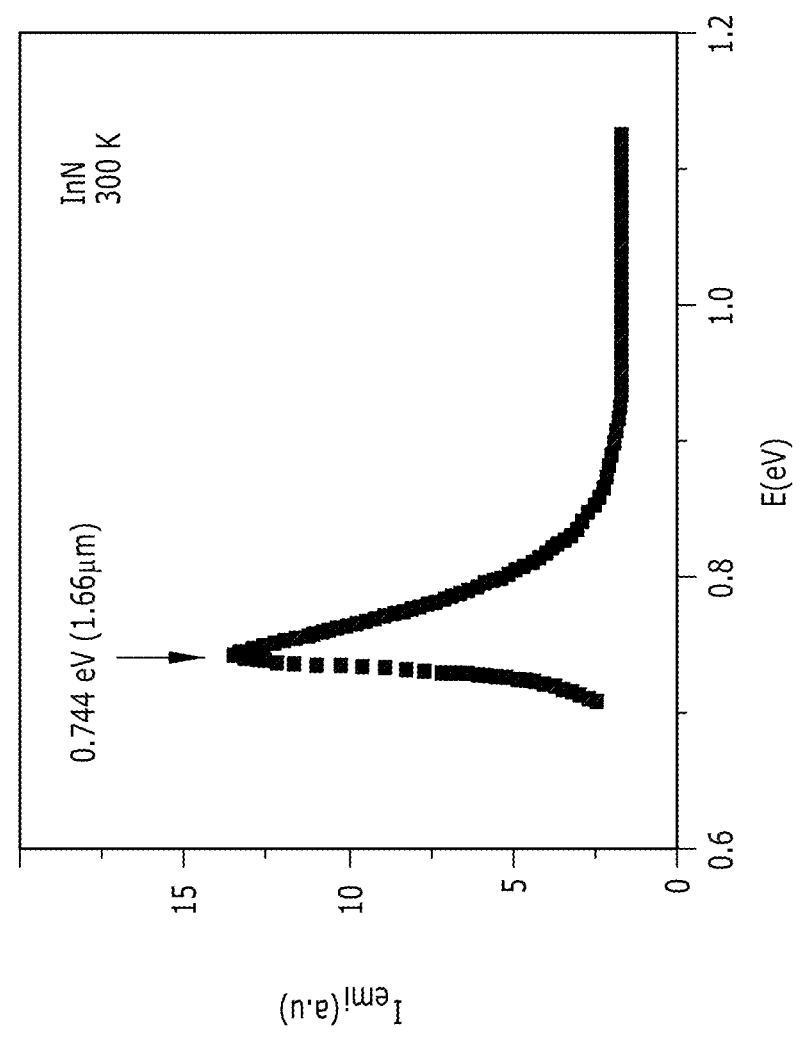
FIG. 4 depicts a room temperature photoluminescence spectrum of an InN epilayer grown by metal organic chemical vapor deposition, exhibiting an emission energy peak near 0.744 eV or 1.66 μm.

Thus, based on the above foundational discussion, in addition to the detailed discussion below, the present disclosure describes systems and methods for the design and fabrication of an optical phased array (OPA) operating at a wavelength around 1.5 μm. As schematically illustrated in FIGS. 1A and 1B, the OPA of the present disclosure operates in the reflective mode and has the capability of mitigating atmospheric turbulence and aero-optical turbulence by directly controlling the laser beam front through controlling the phases of individual pixels. FIG. 2 teaches how the phase shifting of individual pixels is controlled by utilizing the effects of (a) quantum confinement, (b) quantum Stark, and (c) band filling in InGaN/GaN MQW. FIG. 3 teaches how the reflectivity of a pixel can be controlled by applying different voltages across the pixel. The ability of controlling the phase shifting of individual pixels within an InGaN/GaN MQW OPA of the present disclosure is based on the following two key criteria:

(1) As shown in FIG. 4, InN has an energy bandgap near 0.744 eV (or 1.66 μm). Consequence, $In_{1-x}Ga_xN$ alloys have a tunable bandgap and $In_{1-x}Ga_xN$ (x=0.05) has an energy bandgap of $E_g \approx hv$ (1.5 μm) [19].

(2) InN-rich $In_xGa_{1-x}N$ alloys possess the unique property of exceptionally high carrier-induced refractive index (n) change while the free-carrier induced optical loss is extremely low. At 1.5 μm, increasing the concentrations of free electrons and free holes by $5 \times 10^{18}$ $cm^{-3}$ produces >4% a change in n by more than 4% or Δn>0.11 [20].

Figure 2A:
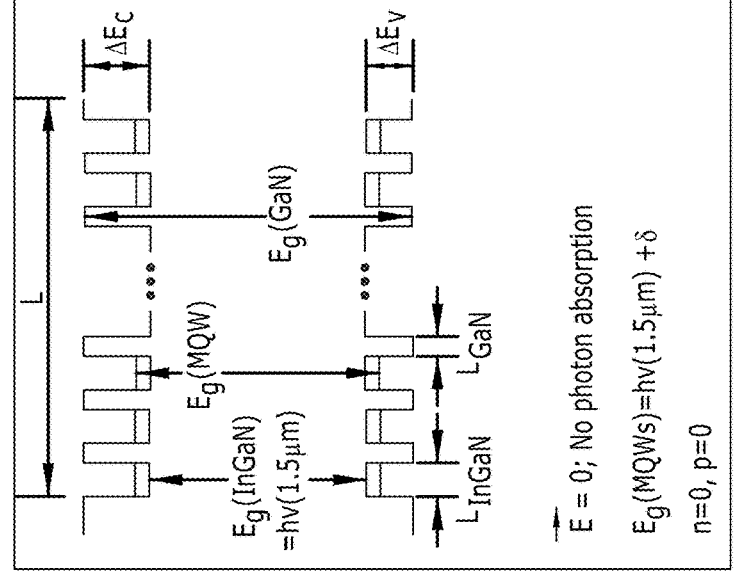
Figure 3:
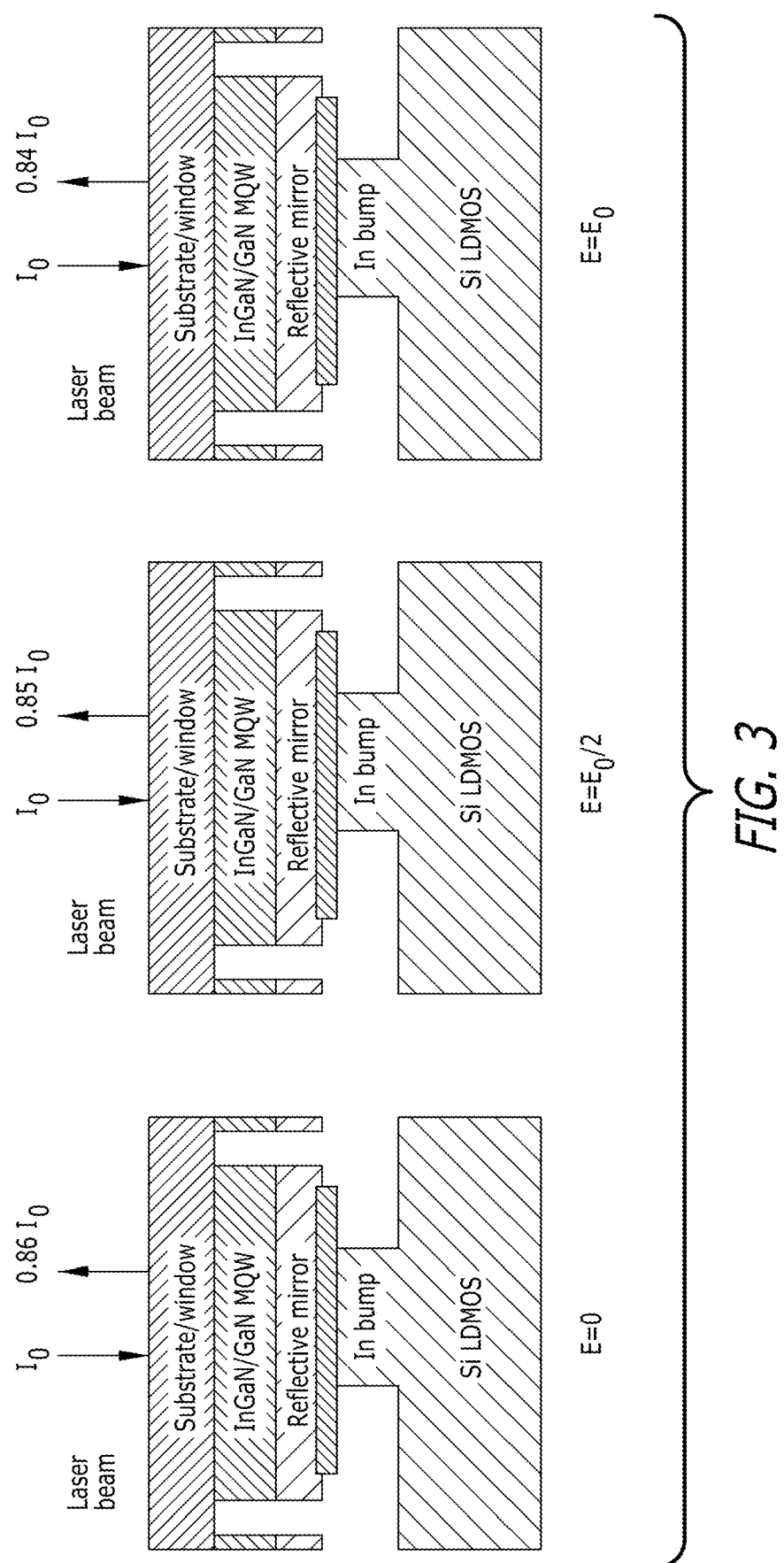
FIG. 3 depicts an illustration of three representative pixel states within an OPA of the present disclosure: (1) in the absence of an applied electric field (E=0), no optical absorption at 1.5 μm occurs in MQW and 86% of laser beam is reflected back; (2) at $E=E_o/2$, 1% of laser beam is absorbed by MQW and 85% of laser beam is reflected back; (3) at $E=E_o$, 2% of laser beam is absorbed by MQW and 84% of laser beam is reflected back. The total active layer thickness or the sum of well thicknesses, $L_w$, is designed to be about 3.6 μm, providing a change in optical path length of $\Delta L = 2L_w$ (InGaN) $\Delta n = 2 \times 3.6$ μm $\times 0.11 = 0.79$ μm.

Therefore, the principle of InGaN/GaN MQW OPAs of the present disclosure is analogous to the use of each pixel in an InGaN/GaN MQW OPA as a charge carrier or electric field (E) induced electro-optic phase modulator, based on the understanding of the following physical processes:

(1) As illustrated in FIG. 2A, in the state of E=0, photon absorption at 1.5 μm within $In_{1-x}Ga_xN$ MQW (x=0.05) is negligibly small since the apparent energy bandgap of the MQW is slightly higher than the photon energy of the laser beam by an amount of quantum confinement energy (δ), $E_g$ (MQWs)=hv (1.5 μm-0.8 eV)+8. In this state, 86% of laser beam is reflected back, whereas 86% is the reflectivity or the filling factor of the OPA of the present disclosure, which is obtained by knowing that the pixel size is designed to be 0.7 μm, pixel pitch is designed to be 0.75 μm, and the reflectivity of the back reflective mirror is designed have a reflectivity of equal or greater than 99%, giving (0.7 μm/0.75 μm) 2-1% (mirror)=86%;

(2) As shown in FIG. 2B, under an applied field (E), $E_g$ (MQW) will be reduced to below hv (1.5 μm=0.8 eV) due to quantum stark effect. This will induce absorption of laser photons and free carrier (electrons and holes) generation in $In_{1-x}Ga_xN$ MQW, whereas the E field is continuously controlled (up to $E_0 \approx 10^5$ V/cm) by the bias voltage applied to each pixel via an LDMOS IC driver (up to 50 V). More specifically, at $E=E_o/2$, 1% of laser beam is absorbed by MQW and consequently 85% of laser beam is reflected back; at $E=E_o$, 2% of laser beam is absorbed by MQW and 84% of laser beam is reflected back. These scenarios are illustrated in FIG. 3.

(3) Accompanying with the charge carrier generation is the effect of band filling in the conduction and valence bands of InGaN wells, i.e., the Fermi levels of electrons and holes in the wells increase with fee carrier generation, so that $E_g$ (MQWs)=hv (1.5 μm=0.8 eV)+δ is again attained, as illustrated in FIG. 2C. Beyond this point, no further photon absorption in MQW occurs, and an equilibrium carrier concentration, $n_{equ}$, is established. The value of $n_{equ}$ in each pixel depends on the magnitude of the applied E field and can be continuously controlled.

Figure 5:
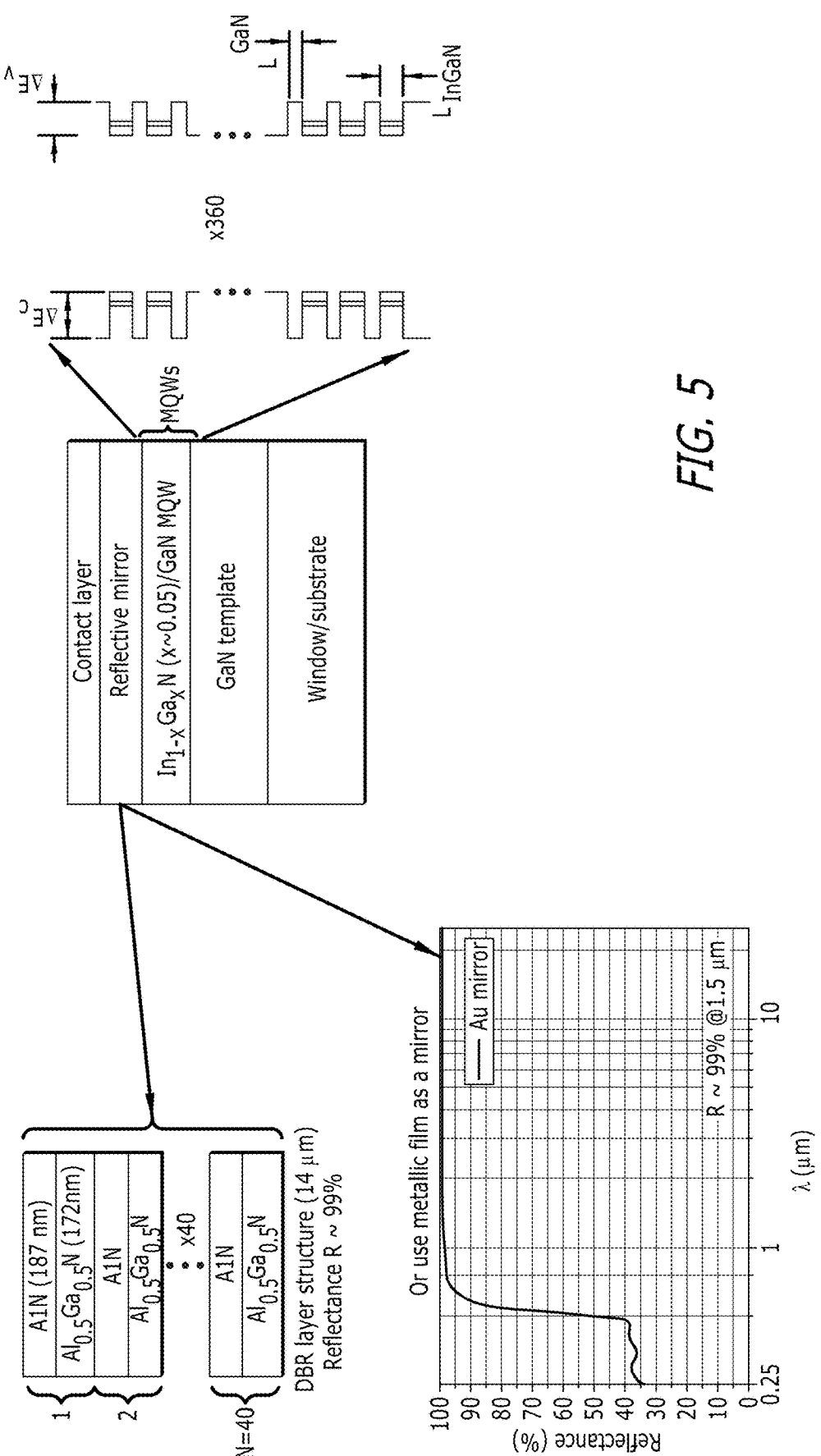
FIG. 5 depicts a zoom-in view of a detailed layer structure of InGaN/GaN MQW OPAs of the present disclosure. The highly reflective mirror can be constructed from a thin metallic layer including gold, silver, and aluminum. The highly reflective mirror can also be a monolithically grown distributed Bragg reflector (DBR) based on multilayers of III-nitride materials.

(4) The attainment of an equilibrium carrier concentration leads to a reduction in the refractive index as well as a phase shift in each pixel of OPA at 1.5 μm. A change from a very low intrinsic carrier concentration to $5 \times 10^{18}$ $cm^{-3}$ in $n_{equ}$ will produce a corresponding change in the refractive index at 1.5 μm by an amount of 0.11, as calculated for In-rich InGaN alloys [20]. One embodiment of the present disclosure provides a MQW structure as shown in FIG. 5, which consists of InGaN wells with a well width of around 10 nm, GaN barriers width a barrier width of around 2.5 nm, and a total number of periods of around 360, which gives a total thickness of InGaN wells of $L_w$=3.6 μm. With a total thickness of InGaN wells of $L_w$=3.6 μm and an insertion of a 99% reflective mirror, the total optical path variation is thus:

$$\Delta L = 2L_w(InGaN)\Delta n = 2 \times 3.6 \text{ μm} \times 0.11 = 0.79 \text{ μm}. \quad (1)$$

This provides an ability of phase control in each pixel from 0 to greater than π (=2π×0.79 μm/1.5 μm=1.05π) with the aid of a controllable electric field E via an LDMOS IC driver.

(5) The estimated fraction of the laser power needed to maintain a maximum carrier concentration of $5 \times 10^{18}$ $cm^{-3}$ is less than 2% when laser power density is above $1.3 \times 10^5$ $W/cm^2$, which can be seen from the following calculations. A free carrier concentration of $5 \times 10^{18}$ $cm^{-3}$ corresponds to a two-dimensional (2D) electron density ($n_0^{2D}$) and hole density ($p_0^{2D}$) in InGaN wells (with a total thickness of 3.6 μm) of $n_0^{2D}=p_0^{2D} \approx 5 \times 10^{18}$ $cm^{-3} \times 3.6 \times 10^{-4}$ cm=$1.8 \times 10^{15}$ $cm^{-2}$. The photon flux, G, needed to sustain this 2D carrier density can be obtained from:

$$dn^{2D}/dt = G - n^{2D}/\tau, \quad (2)$$

where τ is decay lifetime of photo-generated electrons and holes, which is around $10^{-7}$ s in InGaN/GaN MQW. This implies that under equilibrium, $G=n_0^{2D}/\tau=(1.8 \times 10^{15}$ $cm^{-2})/10^{-7}$ s=$1.8 \times 10^{22}$ $cm^{-2} \cdot s^{-1}$. Since hv(1.5 μm)=0.8 eV and the efficiency of photo-carrier generation is almost 100% in InGaN, the optical power density needed to maintain an equilibrium carrier concentration of $5 \times 10^{18}$ $cm^{-3}$ is thus, $$P(n_{equ}) = hvG = 0.8 \text{ eV} \times 1.8 \times 10^{22} \text{ cm}^{-2} \cdot s^{-1} = 1.44 \times 10^{22}$$
$$\text{eV cm}^{-2} \cdot s^{-1} = 2.3 \times 10^3 \text{J} \cdot cm^{-2} \cdot s^{-1} = 2.3 \times 10^3$$
$$W/cm^2. \quad (3)$$

For a typical laser having an optical power of 1 kW at 1.5 μm and a beam diameter as large as 1 mm (area A=7.85× $10^{-3}$ $cm^2$), it corresponds to a laser power density of P (Laser)=$10^3$ W/7.85×$10^{-3}$ $cm^2$=$1.3 \times 10^5$ $W/cm^2$. When this laser beam passes through and is reflected from the OPA of the present disclosure, only a fraction of less than 2% (=$2.3 \times 10^3$ $Wcm^{-2}/1.3 \times 10^5$ $Wcm^{-2}$) of the laser power will be enough to generate and uphold a sufficiently high carrier density in MQW to effectively change the refractive index of InGaN and subsequently cause a phase shift of laser beam in each pixel of OPA. It is worth to note that this estimate of laser power density is extremely conservative because most high energy lasers have a power density greatly exceeding $1.3 \times 10^5$ $W/cm^2$. This implies that even a smaller fraction of laser power will be sufficient to generate and maintain a free carrier concentration of $n_0^{2D}=p_0^{2D} \approx 5 \times 10^{18}$ $cm^{-3}$. So effectively, InGaN/GaN MQW pixels play the role of using a very small fraction of the laser beam (less than 2%) to modulate the phase of the laser beam.

The band offsets of the conduction band ($\Delta E_C$) and valence band ($\Delta E_V$) between In-rich InGaN and GaN are very large. This together with a sufficiently large well width (~10 nm) makes the tunneling current in the MQWs to be negligibly small under an applied electric field.

FIG. 5 presents a detailed layer structure of InGaN/GaN MQW OPAs of the present disclosure In one aspect of the present disclosure, $In_{1-x}Ga_xN$ and GaN epilayers and $In_{1-x}Ga_xN/GaN$ (x=0.05) MQW are produced by epitaxial growth techniques, using metal organic chemical vapor deposition (MOCVD), molecular beam epitaxy (MBE), or hydride vapor phase epitaxy (HVPE) on double side polished sapphire substrates. The highly reflective mirror can be constructed from a thin metallic layer including gold, silver, and aluminum. The highly reflective mirror can also be a monolithically grown distributed Bragg reflector (DBR) based on multilayers of III-nitride materials.

Figure 6:
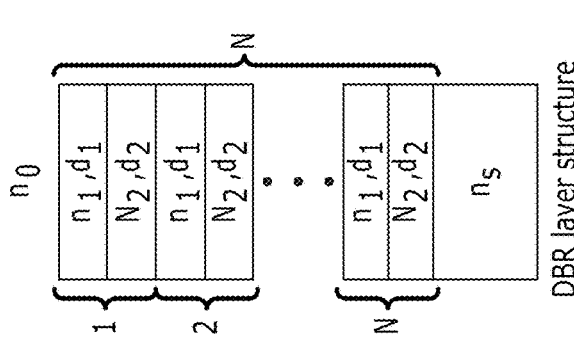
FIG. 6 depicts simulated reflectivity of a representative distributed Bragg reflector (DBR) based on multilayers of III-nitride materials, e.g., $AlN/Al_{0.5}Ga_{0.5}N$ DBR, at 1550 nm.
Figure 6:
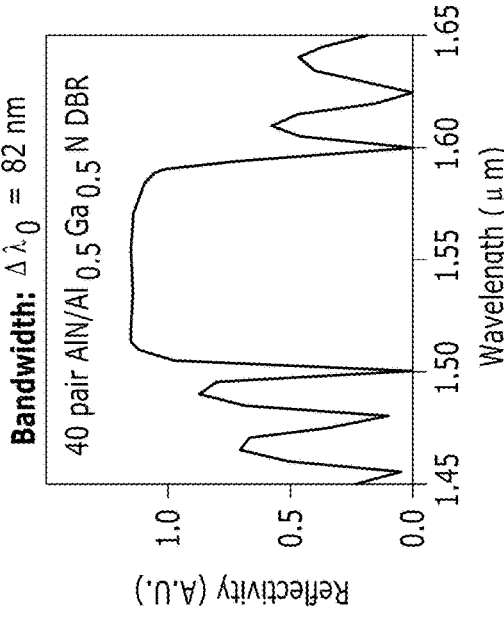

FIG. 6 teaches how to obtain a highly reflective distributed Bragg reflector (DBR) based on multilayers of III-nitride materials, e.g., $AlN/Al_{0.5}Ga_{0.5}N$ DBR, at 1550 nm. In one aspect of the present disclosure, DBR based on multilayers of III-nitride materials are deposited on $In_{1-x}Ga_xN/$ GaN MQW structure using epitaxial growth techniques, including MOCVD, MBE, or HVPE. In another aspect of the present disclosure, the reflective metallic mirrors are deposited on $In_{1-x}Ga_xN/GaN$ MQW structure using an electron-beam evaporation, thermal evaporation, or electroplating.

In another aspect of the present disclosure, the pixel of OPAs will be formed using focused ion beam (FIB), electron-beam lithography together with plasma dry etching, or extremely ultraviolet lithography together with plasma dry etching.

Figure 7:
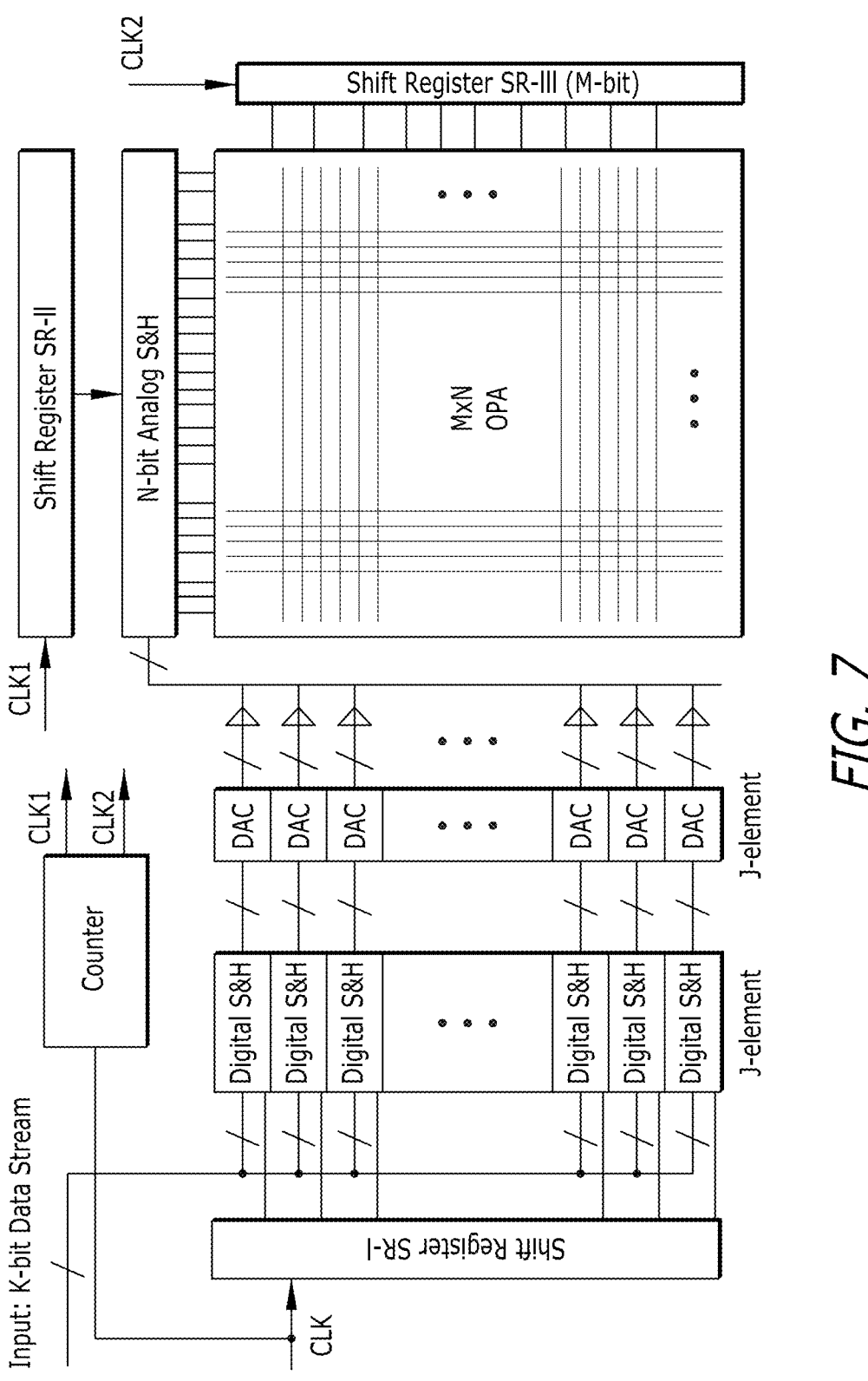
FIG. 7 depicts a block diagram of the integrated OPA driver for controlling the electric field applied to individual pixels of the InGaN/GaN MQW OPA of the present disclosure.

One embodiment of the present disclosure provides a method for fabricating the integrated OPA driver. FIG. 7 teaches the design of a Si LDMOS IC driver. In the design, digital serial data input controls the voltage levels of the M×N OPA pixels. For each pixel, K-bit data is used to represent the desired voltage level from 0 to 50 V providing a field from 0 to $10^5$ V/cm across each pixel. Shift register groups will distribute the clock and data for array element access and control. Shift register SR-I distributes the clock to digital sample-and-hold (digital S&H) circuits with J-elements for parallel processing. The digital input is grouped into J parallel data, each of which is sent to one of the S&H circuits. Therefore, each digital S&H and digital-to-analog converter (DAC) unit only processes every J set of data. This increases the maximum processing speed. The analog signals are then passed to the N-bit analog S&H circuitry to be stored for controlling each row of the OPA. Shift register SR-II controls which analog S&H circuit is sampling at a given time to sequentially program the N-bit analog S&H block. Shift register SR-III steps through the OPA one row at a time, enabling that row to be addressed using the data of the N-bit analog S&H circuits. The counter generates CLK1 and CLK2 to ensure synchronous OPA addressing. For K=8 bits, 0.7-degree average phase resolution can be achieved.

Another embodiment of the present disclosure provides a method to integrate $In_xGa_{1-x}N/GaN$ MQW pixel array with a Si LDMOS driver to allow an independent control of the bias voltage applied to each pixel. FIG. 3 teaches that the integration method is flip-chip bonding via indium bumps. Note that a high-resolution self-emissive microdisplay based on InGaN microLEDs and operating in an active driving scheme was realized via hybrid integration between an InGaN microLED array and a silicon integrated circuit chip using flip-chip bonding via indium bumps [21-23]. However, the pixel size feature of InGaN/GaN MQW OPAs of the present disclosure is about 1 order of magnitude smaller than that of InGaN microLEDs.

Figure 8A:
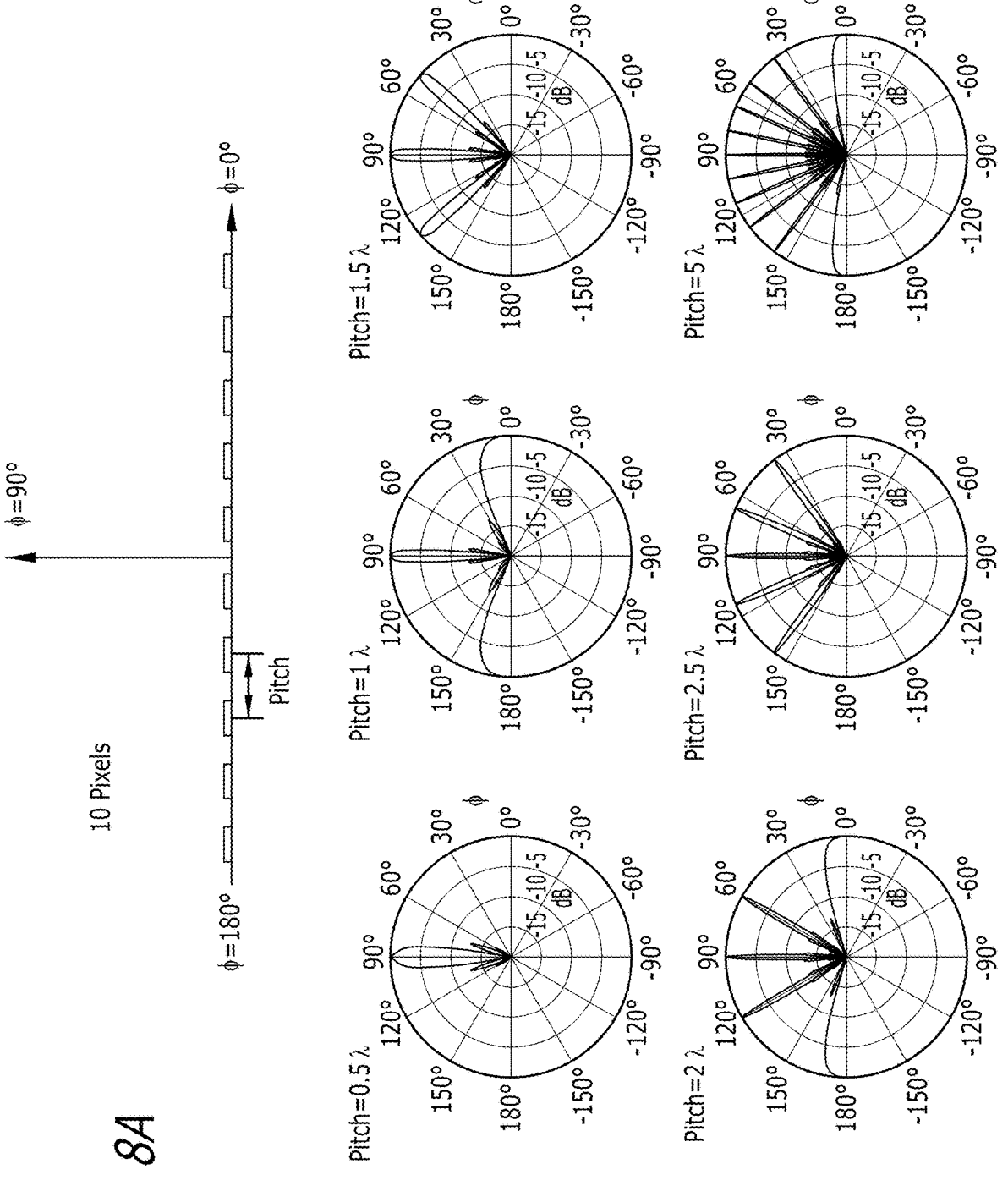
FIG. 8A depicts a far field radiation pattern of a reflected beam from 1×10 uniformly distributed linear arrays with different pixel pitches with the main beam being steered to broadside ($\Phi$=90°).
Figure 8B:
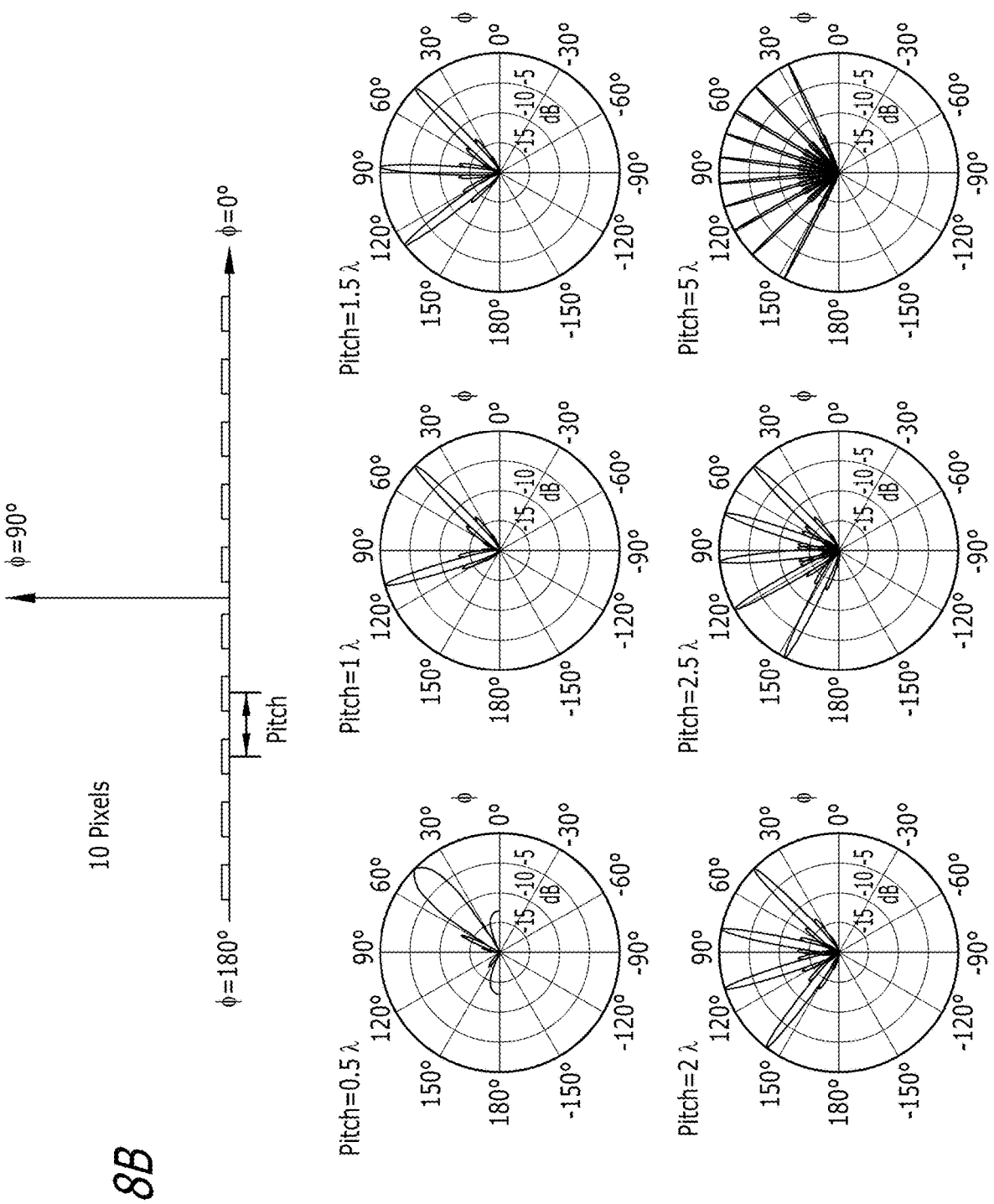
FIG. 8B depicts a far field radiation pattern of a reflected beam from uniformly distributed linear arrays with different pixel pitches with the main beam being steered to $\Phi$=450. The inset is a schematic of such a one-dimensional 1×10 uniformly distributed InGaN/GaN MQW linear array in which the reflected beam is steered by controlling the relative phase of each pixel.

FIG. 8A shows the predicted far field radiation patterns of a reflected laser beam from a one-dimensional 1×10 uniformly distributed InGaN/GaN MQW linear array in which the reflected beam is steered by controlling the relative phase of each pixel with the main beam being steered to broadside ($\Phi=90°$). FIG. 8B shows the predicted far field radiation patterns of a reflected laser beam from a one-dimensional 1×10 uniformly distributed InGaN/GaN MQW linear array in which the reflected beam is steered by controlling the relative phase of each pixel with the main beam being steered to $\Phi=450$. In both cases, the pixel pitch varies from 5λ to 0.5λ, where λ is the emission wavelength of the laser beam and λ=1.5 µm in one case. Both cases teach that for any given pixel pitch value, the radiation pattern is predictable.

Figures 9A, 9B:
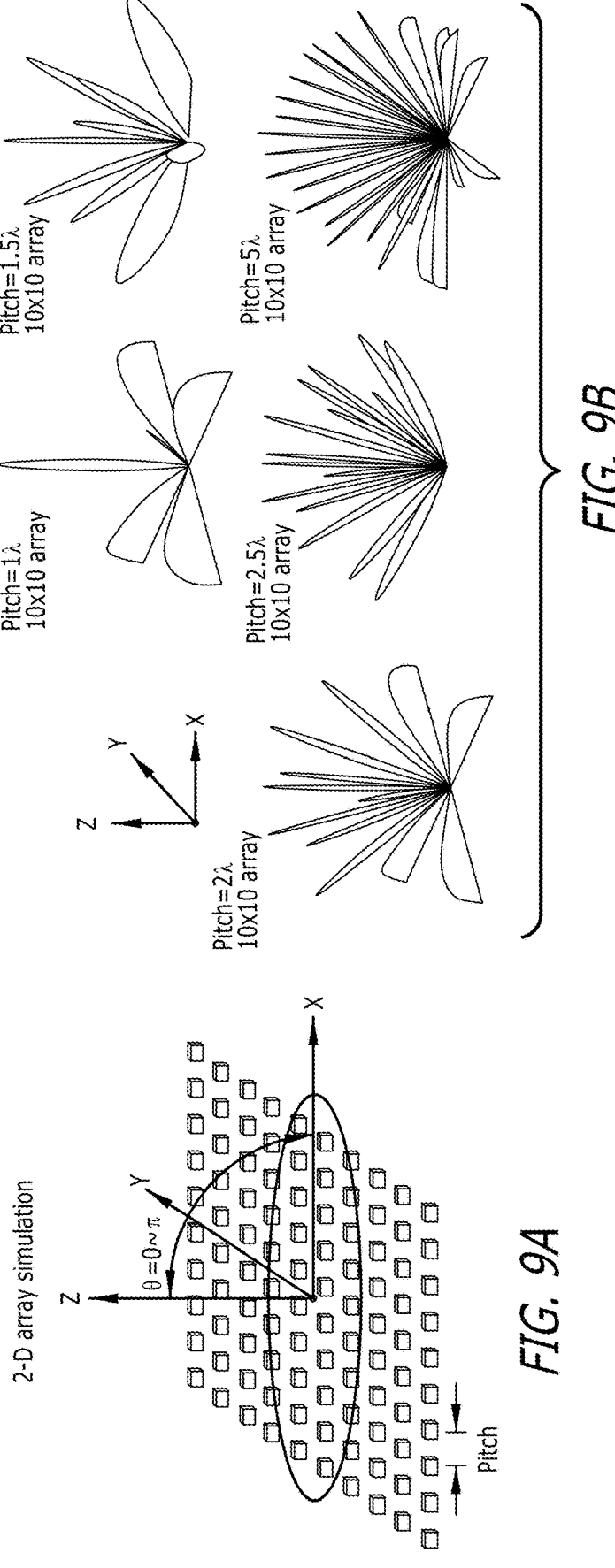
FIG. 9A-B depicts a far field radiation pattern of a reflected beam from 10×10 OPAs with different pixel pitches with the main beam being steered to broadside (z-axis, or $\theta=0°$).

FIGS. 9A-B show the predicted far field radiation patterns of a reflected laser beam from 10×10 InGaN/GaN MQW OPAs (FIG. 9A) in which the reflected beam is steered by controlling the relative phase of each pixel with different pixel pitches and with the main beam being steered to broadside (z-axis, or $\theta=0°$). The simulation results teach that for any given pixel pitch value, the radiation pattern is predictable (FIG. 9B).

Figure 10:
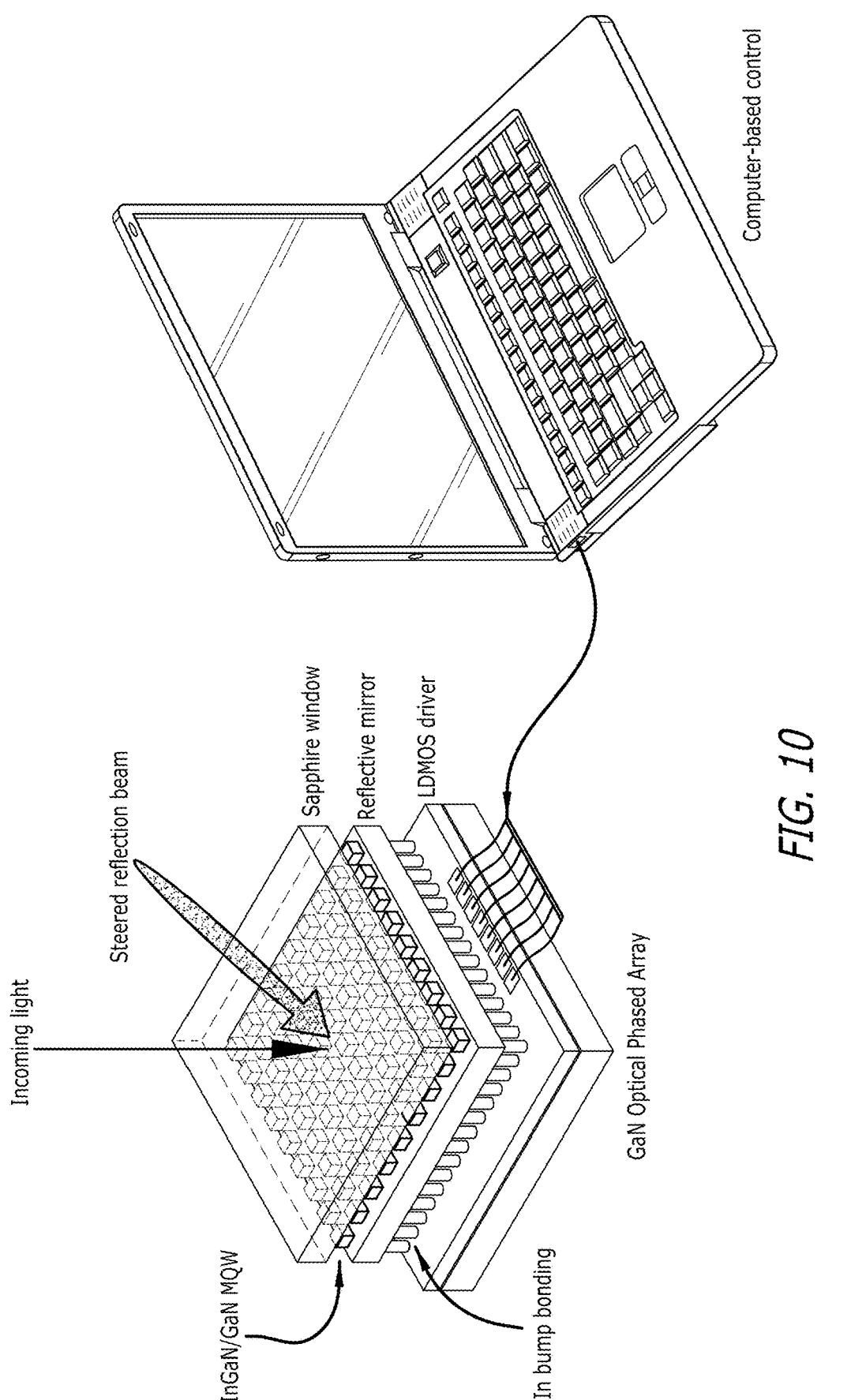
FIG. 10 depicts a schematic illustration of using an InGaN OPA for laser beam steering and controlling.
Figure 11:
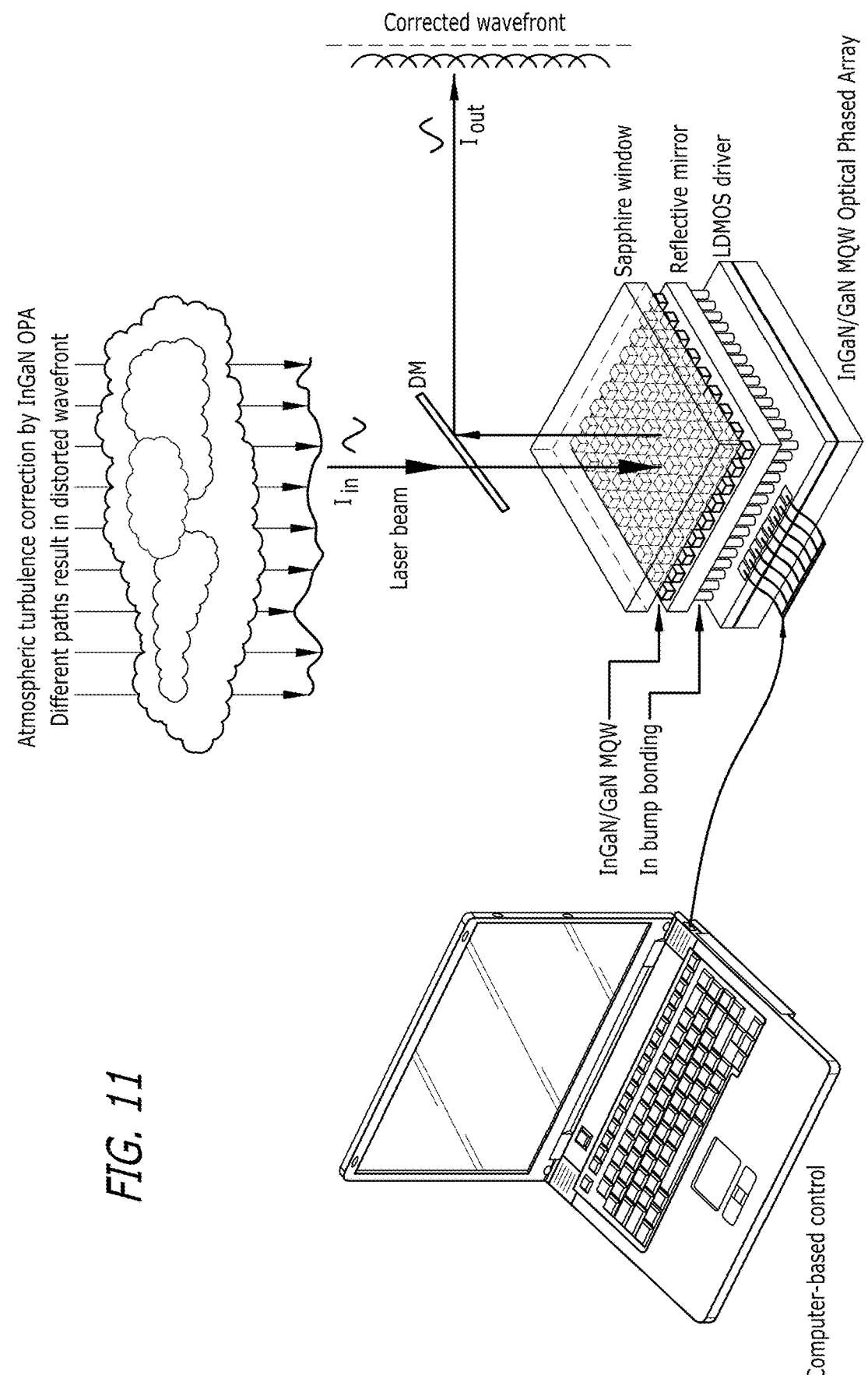
FIG. 11 depicts a schematic illustration of using an InGaN OPA for correcting the atmospheric and aero-optical turbulences by directly controlling the laser beam front.
Figure 12:
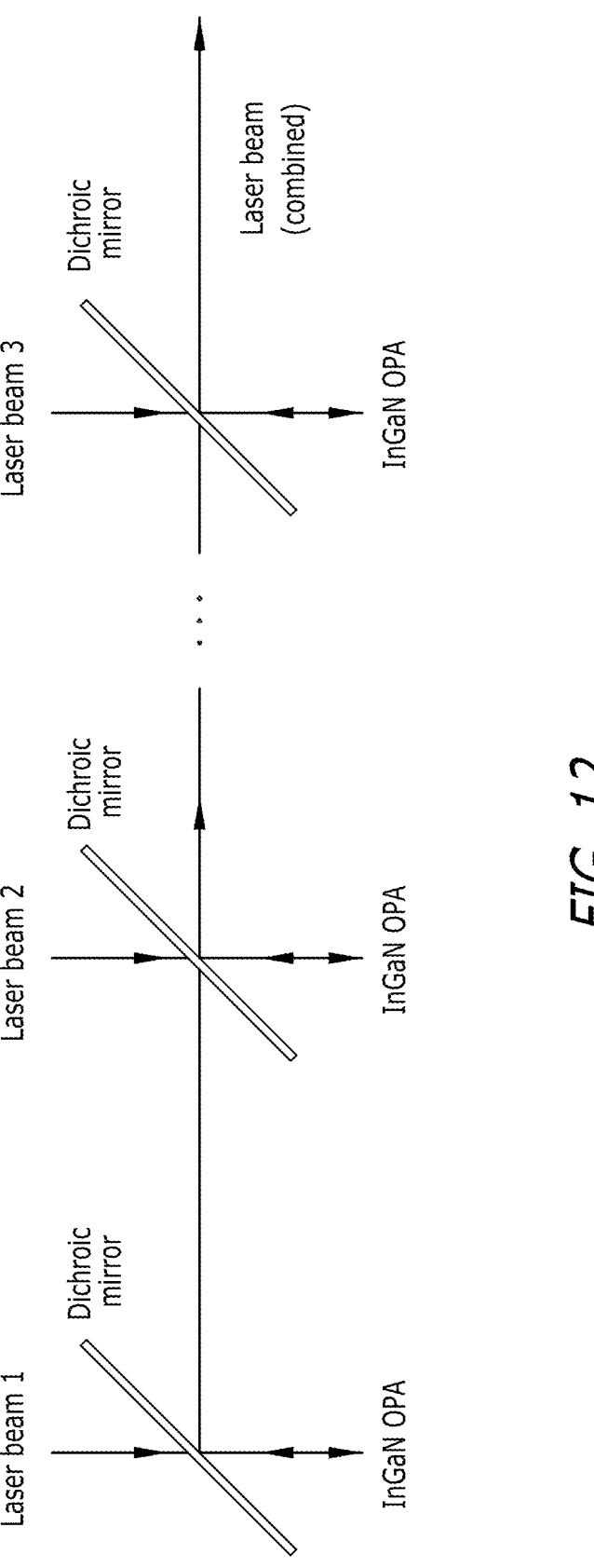
FIG. 12 depicts a schematic illustration of using InGaN OPAs for combining multiple laser beams.

InGaN/GaN MQW OPAs of the present disclosure have many HEL applications including laser beam steering, mitigation of turbulence and laser beam combining and controlling. The OPAs of the present disclosure possess advantages of active phase tunability for each pixel, highly tolerant of phase errors and high power due to the high power/temperature handling capability and high thermal conductivity of III-nitrides. The expected response of the proposed OPA is around $10^{-7}$ s, since it is only limited by the electro-optic effect in InGaN and the Si LDMOS switching speed. Furthermore, the OPAs of the present disclosure can be scaled to very large size phased arrays such as $10^4×10^4$ pixel arrays (with a dimension of 7.5 mm×7.5 mm). FIG. 10 teaches how to use an InGaN/GaN MQW OPA for laser beam steering and controlling. FIG. 11 teaches how to use an InGaN/GaN MQW OPA for correcting the atmospheric and aero-optical turbulences by directly controlling the laser beam front. FIG. 12 teaches how to use InGaN/GaN MQW OPAs for combining multiple laser beams.

As InGaN can be designed to be completely transparent down to ~400 nm by varying the Ga composition, the operating wavelengths can be extended to visible region by further reducing the pixel size and pitch of the OPA.

Figure 13:
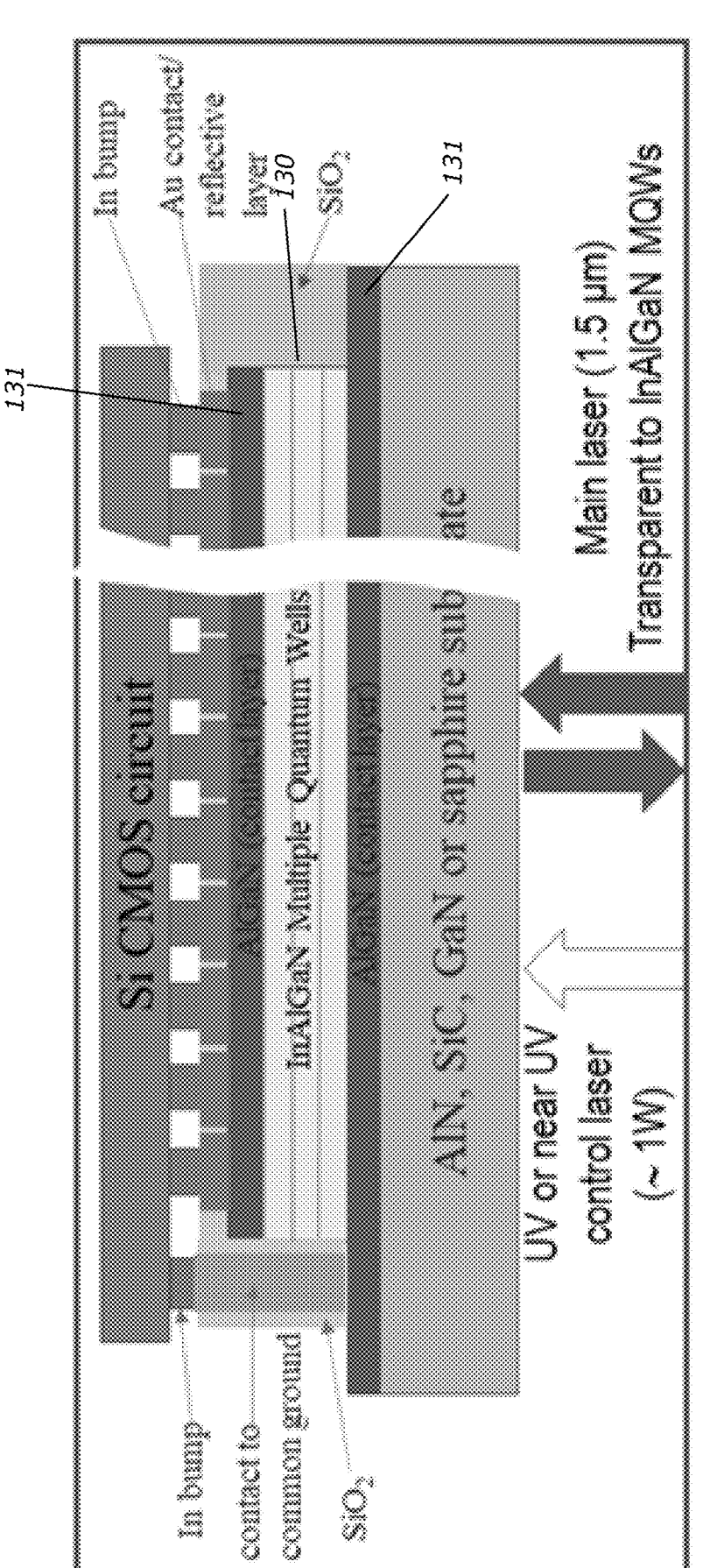
FIG. 13 depicts schematics of an OPA layer structure based on III-nitride wide bandgap semiconductors, in accordance with certain embodiments of the present disclosure.

FIG. 13 depicts schematics of an OPA layer structure based on III-nitride wide bandgap semiconductors, in accordance with certain embodiments of the present disclosure. The OPA layer structure of FIG. 13 can include a bandgap of MQW that is not limited to below the photon energy of the main laser at 1.5 µm (~0.8 eV). In such an embodiments, the OPA MQW design can be significantly relaxed.

Further, in the embodiment depicted in FIG. 13, the OPA device structure can incorporate Ga-rich (InGaN/AlGaN multiple quantum wells) or $Al_yGa_{1-y}N/Al_xGa_{1-x}N$ (y<x) multiple quantum wells as an active medium which is transparent to the main laser wavelength@1.5 µm. Accordingly, in this embodiment, the absorption of the main laser beam by OPA and heat generation in OPA can be minimized.

The phase of each pixel in the OPA at 1.5 µm can be controlled independently via electro-optic effect through the integration between OPA pixels with a CMOS IC driver to achieve the manipulation of the distribution of optical power in the far field. In some embodiments, the OPA design using InAlGaN in the MQWs can allow one to separate the control laser and the main laser. In certain embodiments, a separate control laser beam with an excitation energy near the bandgap of the well material in the MQW can be used to generate and uphold a sufficiently high carrier density to provide further help in changing the refractive index of MQW pixels at the main laser wavelength region.

The OPA design of FIG. 13 can also allow the wavelength of the control laser beam to be chosen such that it can penetrate the MQW to generate free carries in InAlGaN via the mechanism of near band-edge excitation (near 400 nm). The OPA design using InAlGaN in the MQWs can allow one to push the operating wavelength of the main laser beam to cover the entire IR and visible wavelengths down to the wavelength of the control laser (near 400 nm).

The concept of OPA, as depicted in FIG. 13, can be analogous to the use of III-nitride MQW pixels as a charge carrier or electric field (E) induced electro-optic phase modulator. To achieve this and with the consideration of the main laser beam in each pixel encounters a round trip, the change in the optical path length (ΔL) in each pixel with an active thickness L needs to be $$\Delta L = 2L\Delta n, \tag{4}$$

where $\Delta n$ is the change in index of refractive at the main laser wavelength (1.5 μm). To obtain a phase control at 1.5 μm from 0 to $\pi$, the relation between $\Delta L$ and $\Delta n$ must satisfy:

$$\phi = \frac{2\pi \cdot \Delta L}{\lambda(\mu m)} \geq \pi \text{ or } \phi = \frac{4\pi \cdot L \cdot \Delta n}{1.5 \ \mu m} \geq \pi \tag{5a}$$

$$4L \cdot \Delta n \geq 1.5 \tag{5b}$$

where L is thickness of OPA pixels measured in micron (μm). In certain embodiments, if $\Delta n \sim 0.11$, then a phase change of $\phi \geq \pi$ can be attained with a targeted MQW thickness of L~3.6 μm.

The photoexcited free carriers induced $\Delta n$ in can be estimated using the basic parameter of GaN and can written as $$\Delta n = \frac{-e^2 \lambda^2}{8\pi^2 c^2 n \varepsilon 0} \left( \frac{\Delta N_e}{m_e^*} + \frac{\Delta N_h}{m_h^*} \right) \tag{6}$$

$$\sim \left( 2 \times 10^{-20} \text{ cm}^{-3} \right) \Delta N$$

where $\Delta N (= \Delta N_e = \Delta N_h)$ denotes the photoexcited electron and hole concentrations. In obtaining Eq. (6), $m^*_e$ (GaN)=0.2 $m_o$, $m^*_h$(GaN)=1.4 $m_o$, $\varepsilon_0$=8.9, $\lambda$=1.54 μm, and c=speed of light are used. In some embodiments, the electro-optic (EO) effect induced $\Delta n$ can be written as $$\Delta n = -\frac{1}{2} n_0^3 (\gamma E + RE^2), \tag{7}$$

where E is the applied electric field, and $\gamma$ is the linear and R is the quadratic EO coefficients, respectively. Equation (6) states that $\Delta n$ can be increased by increasing the photoexcited carrier concentration, whereas Eq. (7) states that $\Delta n$ can be increased by increasing the applied external electric field up to the critical field of the OPA material.

In some embodiments, the OPA devices incorporate p-n-p-n alternating doping in AlGaN 131/InGaN 130 multiple quantum well (MQW) structure. In such embodiments, in addition to the presence of a built-in spontaneous polarization field ($P_{SP}$) owning to III-nitride's wurtzite 15 (WZ) crystalline structure, the formation of strained heterostructures and multiple quantum wells (MQWs) introduces an additional built-in piezoelectric field (PPZ). In accordance with this embodiment, both fields of $P_{SP}$ and $P_{PZ}$ on the order of 1 MV/cm can enhance the EO effect. For example, III-nitride QWs (such as GaN/InGaN/GaN and AlGaN/GaN/AlGaN) inherently possess both $P_{SP}$ and $P_{PZ}$, which can be exploited to boost the EO effect. When the 20 barrier material is tensile stressed, the piezoelectric field ($P_{PZ}$) acts in the same direction as the spontaneous field ($P_{SP}$).

In an OPA device, such as the OPA device depicted in FIG. 13, the incorporation of p-n-p-n structure allows OPA to operate in a reversed biased configuration. In the reverse biased configuration, as used in some embodiments, the current of the OPA structure will remain low prior to breakdown.

Figure 14:
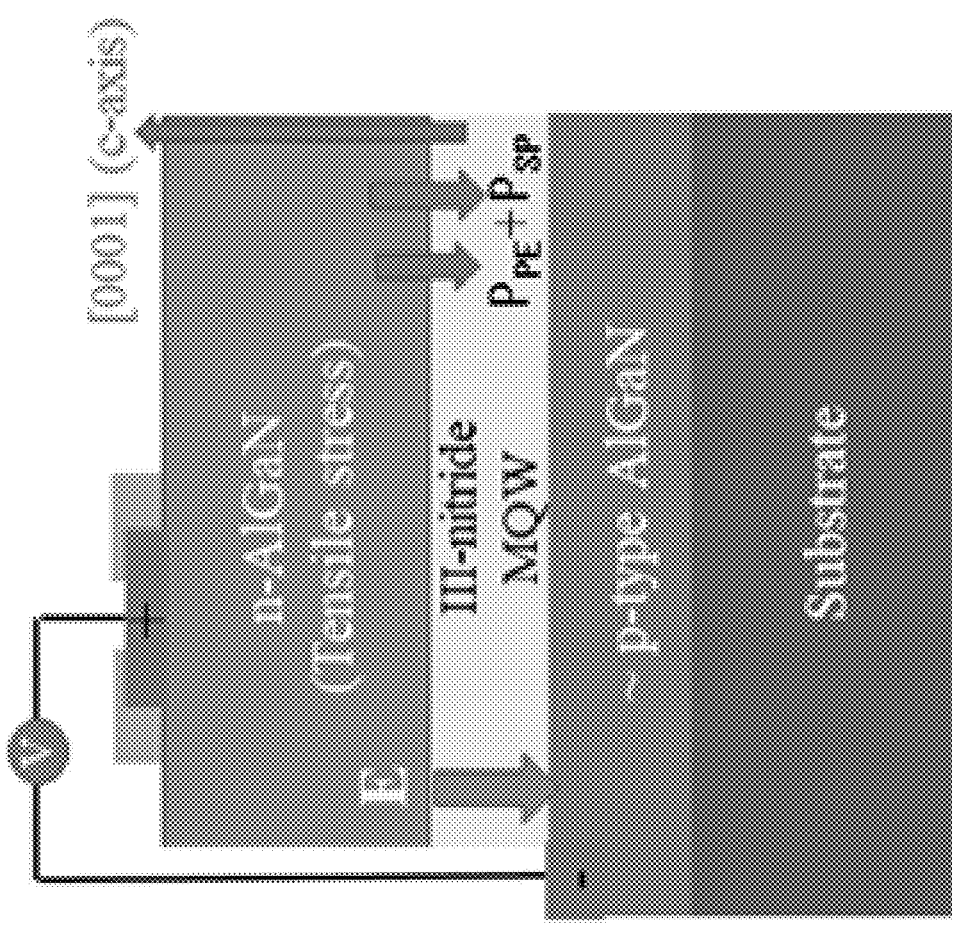
FIG. 14 depicts a schematic view of an inverting p-n-p-n MQW structure deposited on a c-plane substrate, in accordance with certain embodiments of the present disclosure.

FIG. 14 depicts a schematic view of an inverting p-n-p-n MQW structure deposited on a c-plane substrate, in accordance with certain embodiments of the present disclosure. In the structure shown through FIG. 14, a reverse bias is utilized to minimize current and heat generation. In the example shown in FIG. 14, applied electric filed, E, is in the same direction as $P_{PE} + P_{SP}$ to further enhance the EO effect.

In certain embodiments of III-nitride photonic devices utilizing p-n junctions, including but not limited to LEDs and laser diodes, the growth of the device structure starts with n-type layer, followed by MQW active region, and then followed by p-type layer.

When utilizing a reverse bias configuration, the external applied electric field is antiparallel to both the built-in spontaneous polarization field ($P_{SP}$) piezoelectric field ($P_{PZ}$). In an OPA layer device incorporating an inverting p-n-p-n MQW, such as that shown in FIG. 14, when operating in a reversed biased configuration, the direction of the external applied electric field is in the same direction as those of the built-in spontaneous polarization field ($P_{SP}$) and piezoelectric field ($P_{PZ}$). As a result, in such an embodiment, these together can further boost the EO effect.

Figure 15:
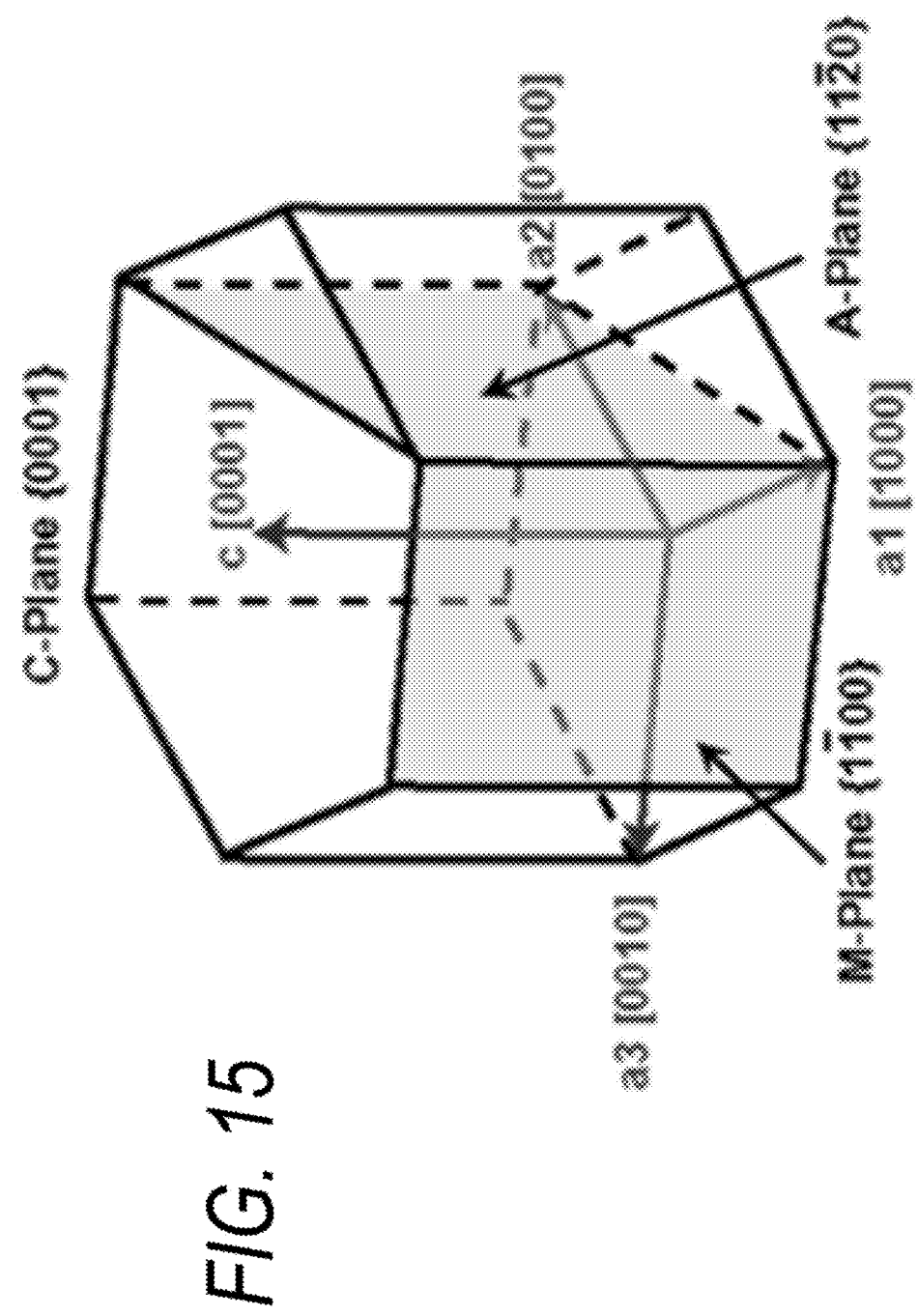
FIG. 15 depicts a schematic diagram showing different crystal planes of wurtzite III-nitrides, in accordance with certain embodiments of the present disclosure.

FIG. 15 depicts a schematic diagram showing different crystal planes of wurtzite III-nitrides, in accordance with certain embodiments of the present disclosure. The component of n ($n_e$) can be utilized using the OPA structure in some embodiments of the present disclosure to produce an a-plane III-nitride OPA structure. Such a structure, as would be on the a-plane depicted in FIG. 15, would be semi-polar. Additionally, in such an embodiment, the contribution of $\Delta n_e$ can be more easily be utilized.

An additional OPA structure for utilizing the component of n ($n_e$) and $\Delta n_e$ can be m-plane III-nitride OPA structure. Structures along the m-plane would be non-polar structures. As illustrated in FIG. 15, the m-plane is perpendicular to the c-plane in III-nitrides. In some embodiments of the present disclosure, when an incoming main laser enters the OPA with its propagation (k-vector) direction perpendicular to the OPA plane, its electric field is polarized along the c-direction ($E_L$//C). In such an embodiment, the configuration supports a maximum $\Delta n_e$. Although an m-plane III-nitride does not possess spontaneous polarization field, the formation of strained heterostructures and multiple quantum wells (MQWs) can introduce a built-in piezoelectric field ($P_{PZ}$), which was shown to significantly enhance the quadratic EO coefficient. Moreover, at relatively high applied electric fields, E>1 MV/cm, as is present in certain embodiments of the present disclosure, the quadratic term shown in Eq. 7, above, makes a major contribution to $\Delta n$, whereas the contribution to $\Delta n$ by the linear term in Eq. 7 can become less significant.

The m-plane OPA layer structures, in some embodiments, can contain large bandgaps of Al-rich AlGaN and AlN. Further, m-plane AlGaN/AlN MQW materials are intrinsically highly resistive. Therefore, in some embodiments, these structures can support high bias voltages with low leakage currents without the need of incorporating an additional p-n-p-n scheme. M-plane p-$Al_yGa_{1-y}$N/n-$Al_xGa_{1-x}$N p-n-p-n MQW structure (y<x) can also be fabricated to further enhance the performance. The basic growth parameters acquired for the growth of c-plane p-$Al_yGa_{1-y}$N/n-$Al_xGa_{1-x}$N p-n-p-n MQW structure.

Figure 16:
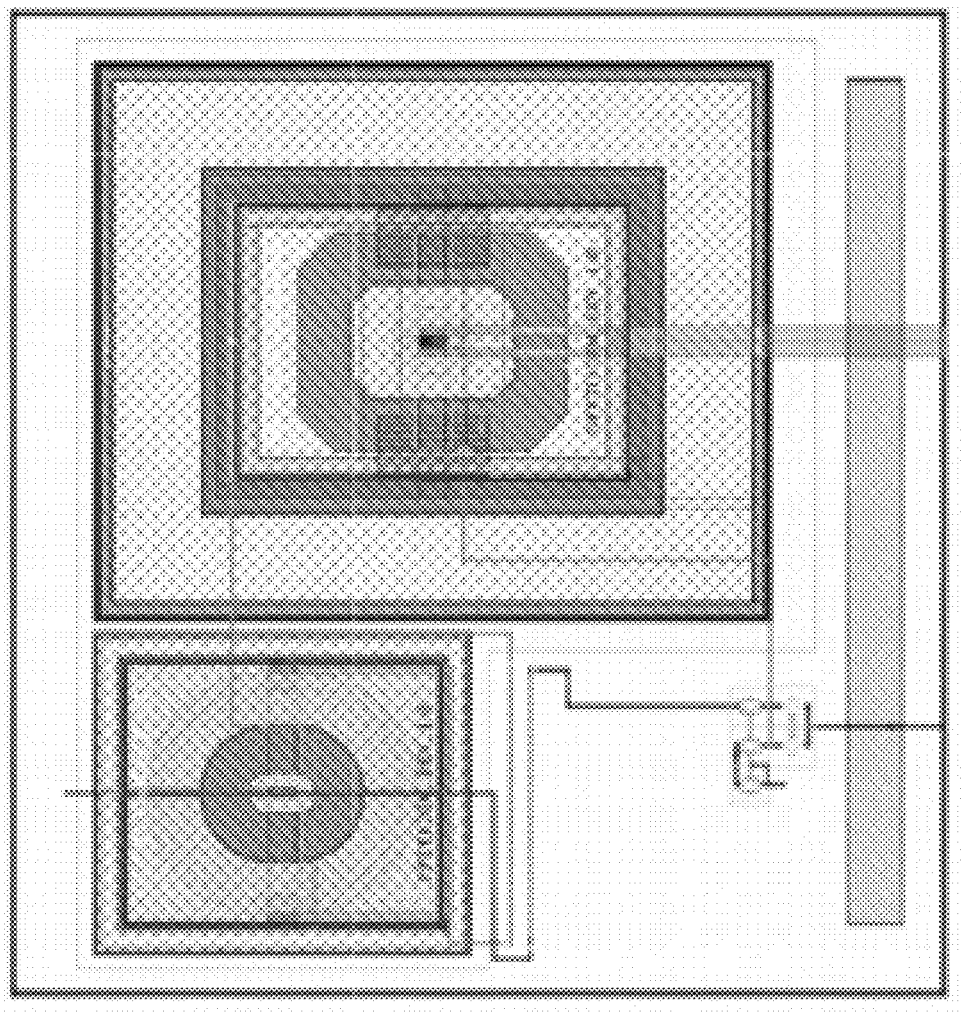
FIG. 16 depicts an exemplary OPA pixel driver layout, in accordance with certain embodiments of the present disclosure.

FIG. 16 depicts an exemplary OPA pixel driver layout, in accordance with embodiments of the present disclosure. In some embodiments, the phase of each pixel in the OPA can be controlled independently via electro-optic effect through the heterogeneous integration between OPA pixels with a CMOS integrated circuit (IC) driver to achieve the manipulation of the distribution of optical power in the far field. In certain embodiments, the layout of the CMOS IC driver can be optimized to a minimum size. Further, in some embodiments, in order to ensure that the space on the semiconductor can be used efficiently, the design can densely packed.

The final layout for an exemplary OPA pixel driver is depicted in FIG. 16. In the example embodiment of FIG. 16, there is unused space in the layout, which may be utilized in the future to add higher resistances to decrease the quiescent current through the device. The exemplary layout shown in FIG. 16 has dimensions of 93.44 μm×88.16 μm (8238 μm2).

Some embodiments of the present disclosure utilize high-voltage PMOS and NMOS cells. These cells can have overall sizes which are relatively large. As such, the cells can take up considerable space compared to the size of individual pixels. The remaining low-voltage FETs and resistors can, in some embodiments, have a relatively smaller impact on the overall size of a single pixel driver cell.

In some embodiments, on-chip metal layers can be utilized to route the bias signal of each pixel to a smaller foot-print that matches the size of the OPA device. In such an embodiment, this can allow a flip-chip-bond between the OPA device and the CMOS driver IC. In such an embodiment, the pixel driver layout can be expanded to large arrays.

The CMOS driver's transfer function provides in certain embodiments a relatively simple interface when an input voltage is used versus an input current. The transistors can offer a semi-linear relationship between input and output voltage.

Further, in the embodiments of the present disclosure, the sampling and compensation capacitors can be tuned to provide ideal performance versus size. In some embodiments, the sample capacitor is tuned first. In such an embodiment, the sample capacitor can sample and hold the low-voltage signal such that it may be amplified using the HV driver circuit. The primary impact of this capacitor is the sample time required to effectively sample the input signal.

Additionally, in some embodiments, the compensation capacitor can also be tuned, In such an embodiment, the compensation capacitor can be used to provide stability to the system and prevent oscillations from occurring in the HV driver circuit that would otherwise impact the accuracy of the output signal.

After optimizing the sizes of the two capacitors, in certain embodiments, an overall driver circuit cell size of 120 μm×120 μm is used. In addition, in some embodiments, the driver cell can be routed using only the bottom three metal layers (M1, M2, and M3). As a result, in such an embodiments, four metal layers may be used to perform the routing required to fully connect the driver circuit array. Moreover, the reserved top four metal layers will enable the further shrinking of the footprint to match with the OPA device with a smaller pitch.

In certain embodiments, to allow for a small pitch in the pixel array, two biasing networks can be used for the CMOS driver: active and passive. The active network can include the CMOS active devices required to sample, hold, and amplify low-voltage signals to the HV domain and the bottom three layers of metals (M1, M2, and M3), while the passive network can include the four metal layers responsible for delivering the HV signal to the OPA. Since two biasing networks can be used, in some embodiments, it is not necessary for the CMOS active driver circuit pitch to match the pitch of the OPA. Instead, in such an embodiment, the passive network consisting of four layers of metal routing can deliver the generated bias voltages to a much smaller array, allowing for a small distance between pixels in the OPA.

Due to the limited spacing between OPA pixels, flip-chip bonding can be used to directly connect the CMOS driver to the OPA pixels. In some embodiments, the CMOS driver IC and the OPA device can be bonded with a small pitch for the device to be appropriately steered.

Figure 17:
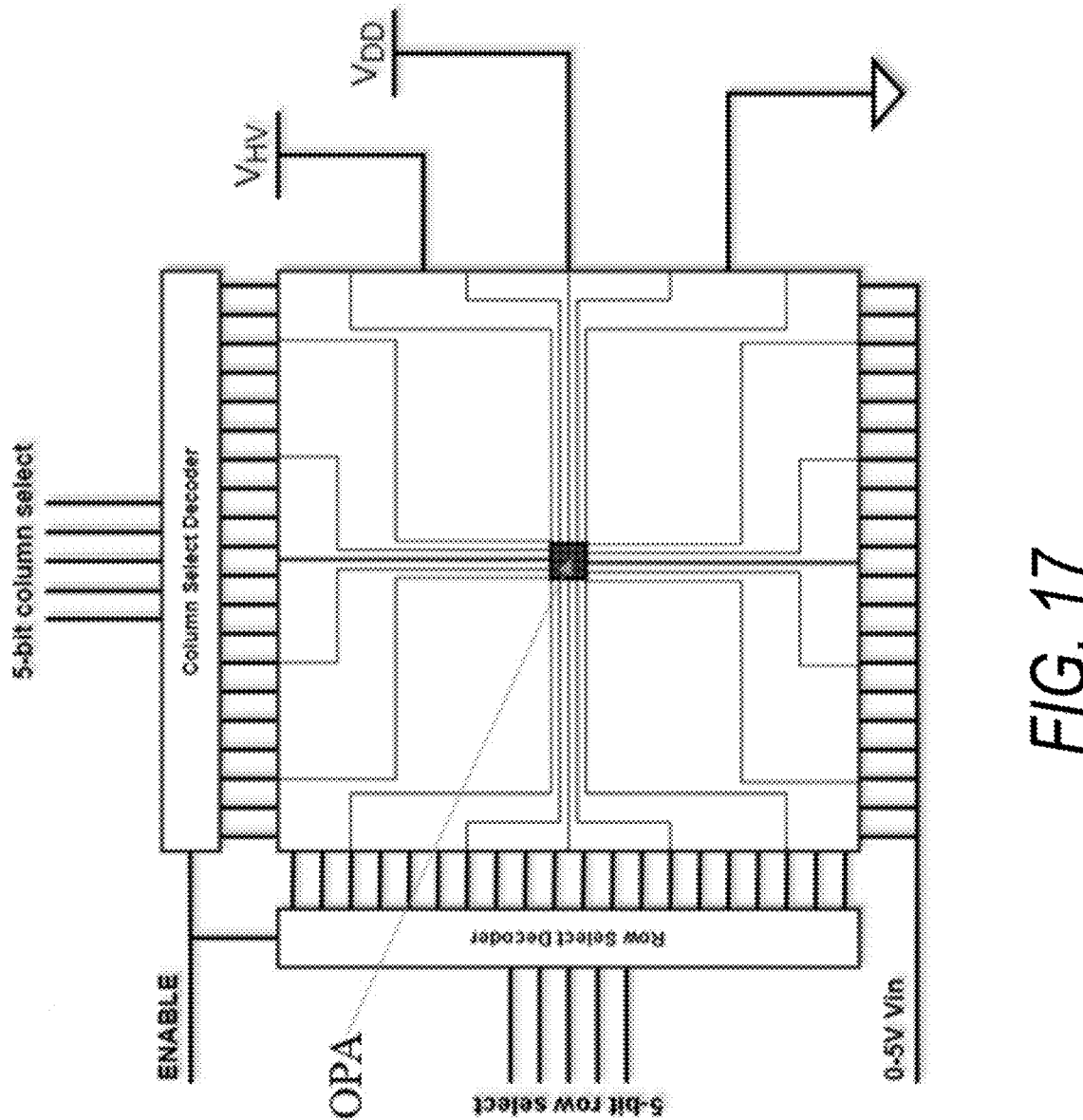
FIG. 17 depicts a top schematic view illustrating the process by which the CMOS driver and OPA can be connected, in accordance with certain embodiments of the present disclosure.

FIG. 17 depicts a top schematic view illustrating the process by which the CMOS driver and OPA will be connected, in accordance with certain embodiments of the present disclosure. In the exemplary embodiment of FIG. 17, the OPA driver circuit can use only 3 metal layers (M1, M2, M3). In such an embodiment, this leaves a total of 4 layers remaining for routing and bonding. Accordingly, for the example of FIG. 17, custom flip-chip pads can thus be created using the top aluminum (AM) layer, which can support small size pads. To prevent inadvertent short-circuits, a passivation layer can be added over the CMOS device. In some embodiments, the passivation layer can be completely removed at the OPA bonding site and precision alignment marks can be placed to align the OPA device and CMOS driver with minimum error. In some embodiments, a new device can be quickly bonded a new driver if there is a short circuit.

Figure 18:
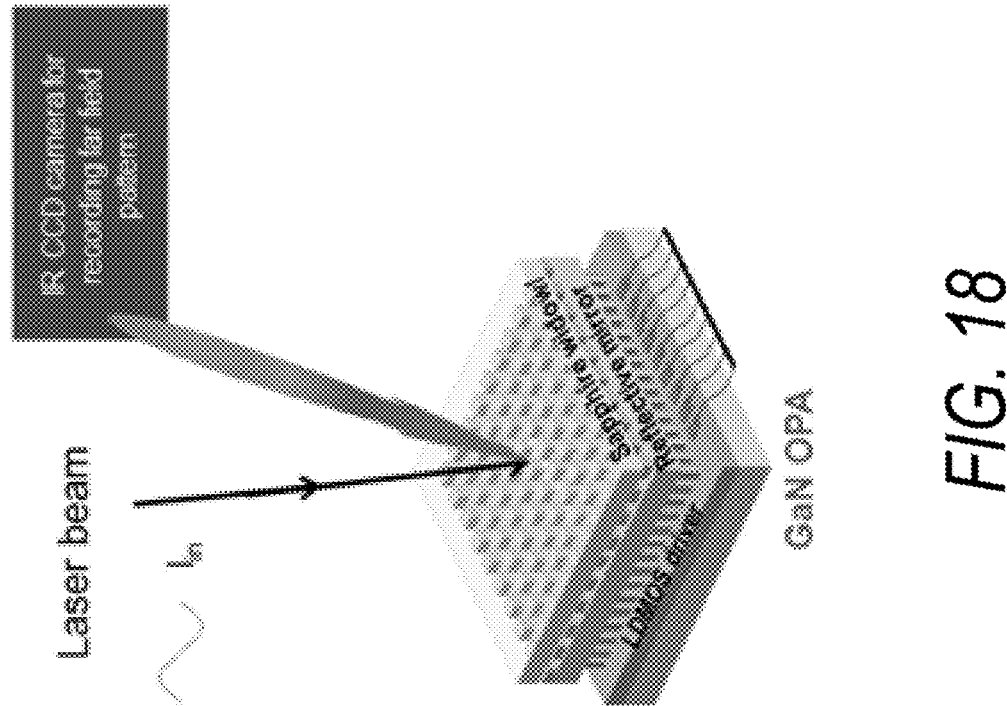
FIG. 18 depicts a schematic illustrating a laser beam steering by a GaN OPA without moving parts, in accordance with certain embodiments of the present disclosure.

FIG. 18 depicts a schematic illustrating a laser beam steering by a GaN OPA without moving parts, in accordance with certain embodiments of the present disclosure. In such an embodiment, the steered laser beam pattern can be observed by monitoring the far field pattern of the reflected main laser on an IR CCD camera.

For any given pixel pitch value (p), the steering angle (Δθ) controlled by the "gate bias" via EO effect can be predicted and can be observed by monitoring the far field pattern of the reflected main laser on an IR CCD camera.

In some embodiments, the OPA chip includes two pixels with a pixel pitch of p=7.5 μm, which can be fabricated from the III-nitride MQW wafer with an active layer thickness of t=0.3 μm. Further, in such an embodiment, the laser beam steering at 1.514 μm can be demonstrated by using the principles discussed in respect to FIG. 18, above. In such an embodiment, by utilizing the strategies for enhancing Δn values discussed above and increasing the OPA active layer thickness (t) as well as by further reducing the pixel pitch (p), the steering range (Δx or Δθ) can be greatly increased.

Consistent with the above disclosure, the examples of systems and method enumerated in the following clauses are specifically contemplated and are intended as a non-limiting set of examples.

Clause 1. A solid-state 2D optical phased array (OPA) including InGaN/AlGaN multiple quantum wells (MQWs) transparent to the wavelength of the main laser with its emitting direction to be steered by the OPA. As a result, the absorption of the main laser beam by OPA can be minimized.

Clause 2. The OPA of any foregoing clause, where the InGaN/AlGaN MQWs structure further can consist of alternating p-type and n-type layers to form an InGaN/AlGaN p-n-p-n MQW structure to allow the OPA to operate in the reversed biased configuration to minimize the operating current and heat generation.

Clause 3. The OPA of any foregoing clause, where the InGaN/AlGaN MQWs can be electrically resistive, resulting in the OPA's operating current being capable of being very low and hence heat generation in OPA can be minimized.

Clause 4. A solid-state 2D optical phased array (OPA) including a $Al_yGa_{1-y}N/Al_xGa_{1-x}N$ (y<x) MQWs structure which is transparent to the main laser wavelength. As a result, the absorption of the main laser beam by OPA can be minimized.

Clause 5. The OPA of any foregoing clause, where the $Al_yGa_{1-y}N/Al_xGa_{1-x}N$ (y<x) MQWs can be electrically resistive, resulting in the OPA's operating current being capable of being very low and heat generation in OPA can be minimized.

Clause 6. The OPA of any foregoing clause, where the $Al_yGa_{1-y}N/Al_xGa_{1-x}N$ (y<x) MQWs structure further consists of alternating p-type and n-type layers to form an $Al_yGa_{1-y}N/Al_xGa_{1-x}N$ (y<x) p-n-p-n MQW structure to allow the OPA to operate in the reversed biased configuration to further minimize the operating current and heat generation.

Clause 7. The OPA of any foregoing clause, where the growth of p-n-p-n MQW structure starting with n-layer in direct contact with the substrate and ending with p-type layer that is facing the main incoming laser beam.

Clause 8. The OPA of any foregoing clause, where the growth of p-n-p-n MQW structure starting with p-layer in direct contact with the substrate and ending with an n-type layer that is facing the main incoming laser beam.

Clause 9. The OPA of any foregoing clause further including a polar c-plane InGaN/AlGaN p-n-p-n MQW structure or a polar c-plane $Al_yGa_{1-y}N/Al_xGa_{1-x}N$ (y<x) p-n-p-n MQW structure, deposited on a substrate including GaN, AlN, SiC, Si and sapphire.

Clause 10. The OPA of any foregoing clause further including a non-polar m-plane InGaN/AlGaN p-n-p-n MQW structure or a non-polar m-plane $Al_yGa_{1-y}N/Al_xGa_{1-x}N$ (y<x) p-n-p-n MQW structure, deposited on a substrate including GaN, AlN, SiC, Si and sapphire.

Clause 11. The OPA of any foregoing clause further including a semi-polar a-plane InGaN/AlGaN p-n-p-n MQW structure or a semi-polar a-plane $Al_yGa_{1-y}N/Al_xGa_{1-x}N$ (y<x) p-n-p-n MQW structure, deposited on a substrate including GaN, AlN, SiC, Si and sapphire.

Clause 12. The OPA of any foregoing clause, where the InGaN/AlGaN or $Al_yGa_{1-y}N/Al_xGa_{1-x}N$ (y<x) (MQWs) structure can accommodate a main laser beam with an emission wavelength of greater than 450 nm (from visible to IR).

Clause 13. The OPA of any foregoing clause, where a phase in each pixel within the OPA can be controlled independently via electro-optic effect in III-nitride MQWs by varying the voltage in each pixel by a Si CMOS array to achieve the manipulation of the distribution of optical power in the far field and steering of the main laser beam.

Clause 14. The OPA of any foregoing clause, where the integration between OPA and Si CMOS array will be accomplished by heterogeneous integration via flip chip bonding using metal bumps.

Clause 15. The OPA of any foregoing clause, where the OPA pixel driver layout can include low-voltage and high-voltage CMOS drivers.

Clause 16. The OPA of any foregoing clause, where the OPA driver circuit can include 3 metal layers used for individual pixels and leaves a total of 4 layers remaining for global routing and bonding. Custom flip-chip pads can be created using the top aluminum layer (AM), which can support small size pads.

Clause 17. The OPA of any foregoing clause, where the OPA and the CMOS driver IC can be bonded by flip-chip-bonding. On-chip metal layers are used to route the bias signal of each pixel to a smaller foot-print that matches the size of the OPA device.

The disclosure has been described with reference to the preferred embodiments. The device layout is only for description purposes, is non-limiting, and may be varied to additional layouts to carry out the present disclosure.

What is claimed is:

1. A solid-state 2D optical phased array (OPA), the OPA comprising:

an InGaN/AlGaN multiple quantum well (MQW) transparent to a wavelength emitted from a laser, wherein the InGaN/AlGaN MQW comprises a plurality of p-type layers alternating with a plurality of n-type layers to form an InGaN/AlGaN p-n-p-n MQW structure, the InGaN/AlGaN MQW is electrically resistive, and the InGaN/AlGaN p-n-p-n MQW structure is configured to allow the OPA to operate in a reversed biased configuration; and an $Al_yGa_{1-y}N/Al_xGa_{1-x}N$ (y<x) MQWs structure transparent to the wavelength emitted from the main laser, wherein the $Al_yGa_{1-y}N/Al_xGa_{1-x}N$ (y<x) MQWs structure comprises a plurality of p-type layers alternating with a plurality of n-type layers to form an $Al_yGa_{1-y}N/Al_xGa_{1-x}N$ (y<x) p-n-p-n MQW structure.

2. The OPA of claim 1, wherein the InGaN/AlGaN p-n-p-n MQW structure comprises a polar c-plane InGaN/AlGaN p-n-p-n MQW structure deposited on a substrate, wherein the substrate comprises GaN, AlN, SiC, Si, and sapphire.

3. The OPA of claim 1, wherein the InGaN/AlGaN p-n-p-n MQW structure comprises a non-polar m-plane InGaN/AlGaN p-n-p-n MQW structure deposited on a substrate, wherein the substrate comprises GaN, AlN, SiC, Si, and sapphire.

4. The OPA of claim 1, wherein the InGaN/AlGaN p-n-p-n MQW structure comprises a semi-polar a-plane InGaN/AlGaN p-n-p-n MQW structure deposited on a substrate, wherein the substrate comprises GaN, AlN, SiC, Si, and sapphire.

5. The OPA of claim 1, wherein the InGaN/AlGaN p-n-p-n MQW structure comprises a first n-type layer, wherein the first n-type layer is in direct contact with a substrate.

6. The OPA of claim 1, wherein the InGaN/AlGaN p-n-p-n MQW structure comprises a last p-type layer, wherein the last p-type layer is positioned to face the main laser.

7. The OPA of claim 1, wherein the laser has an emission wavelength greater than 450 nm.

8. The OPA of claim 1 further comprising a CMOS integrated circuit (IC) driver to independently control each MQW pixel, wherein the each MQW pixel is controlled via electro-optic effect in III-nitride MQWs by varying the voltage in the each MQW pixel by a Si CMOS array.

9. The OPA of claim 8, wherein the Si CMOS array is integrated into the OPA by heterogeneous integration, wherein the heterogeneous integration comprises flip chip bonding using one or more metal bumps.

10. The OPA of claim 8, wherein the CMOS driver IC comprises a low-voltage CMOS driver and a high-voltage CMOS driver.

11. The OPA of claim 8, wherein the CMOS driver IC is bonded to the OPA by flip-chip-bonding.

12. The OPA of claim 1 further comprising an OPA driver circuit, wherein the OPA driver circuit comprises a first metal layer, a second metal layer, a third metal layer, and a plurality of remaining layers, wherein the plurality of remaining layers comprises a circuit area for global routing and bonding.

13. A solid-state 2D optical phased array (OPA), the OPA comprising:

an $Al_yGa_{1-y}N/Al_xGa_{1-x}N$ (y<x) multiple quantum wells (MQW) structure transparent to a wavelength emitted from a laser, wherein the $Al_yGa_{1-y}N/Al_xGa_{1-x}N$ (y<x) MQW structure comprises one or more a plurality of p-type layers alternating with a plurality of n-type layers to form an $Al_yGa_{1-y}N/Al_xGa_{1-x}N$ (y<x) p-n-p-n MQW structure, the $Al_yGa_{1-y}N/Al_xGa_{1-x}N$ (y<x) MQW structure is electrically resistive; and the $Al_yGa_{1-y}N/Al_xGa_{1-x}N$ (y<x) p-n-p-n MQW structure is configured to allow the OPA to operate in a reversed biased configuration.

14. The OPA of claim 13, wherein the $Al_yGa_{1-y}N/Al_xGa_{1-x}N$ (y<x) p-n-p-n MQW structure comprises a polar c-plane $Al_yGa_{1-y}N/Al_xGa_{1-x}N$ (y<x) p-n-p-n MQW structure deposited on a substrate, wherein the substrate comprises GaN, AlN, SiC, Si, and sapphire.

15. The OPA of claim 13, wherein the $Al_yGa_{1-y}N/Al_xGa_{1-x}N$ (y<x) p-n-p-n MQW structure comprises a non-polar m-plane $Al_yGa_{1-y}N/Al_xGa_{1-x}N$ (y<x) p-n-p-n structure deposited on a substrate, wherein the substrate comprises GaN, AlN, SiC, Si, and sapphire.

16. The OPA of claim 13, wherein the $Al_yGa_{1-y}N/Al_xGa_{1-x}N$ (y<x) p-n-p-n MQW structure comprises a semi-polar a-plane $Al_yGa_{1-y}N/Al_xGa_{1-x}N$ (y<x) p-n-p-n MQW structure deposited on a substrate, wherein the substrate comprises GaN, AlN, SiC, Si, and sapphire.

17. The OPA of claim 13, wherein the $Al_yGa_{1-y}N/Al_xGa_{1-x}N$ (y<x) p-n-p-n MQW structure comprises a first n-type layer, wherein the first n-type layer is in direct contact with a substrate.

18. The OPA of claim 13, wherein the $Al_yGa_{1-y}N/Al_xGa_{1-x}N$ (y<x) p-n-p-n MQW structure comprises a last p-type layer, wherein the last p-type layer is positioned to face the main laser.

19. The OPA of claim 13, wherein the laser has an emission wavelength greater than 450 nm.

20. The OPA of claim 13 further comprising a CMOS integrated circuit (IC) driver to independently control each MQW pixel, wherein the each MQW pixel is controlled via electro-optic effect in III-nitride MQWs by varying the voltage in the each MQW pixel by a Si CMOS array.

21. The OPA of claim 20, wherein the Si CMOS array is integrated into the OPA by heterogeneous integration, wherein the heterogeneous integration comprises flip chip bonding using one or more metal bumps.

22. The OPA of claim 20, wherein the CMOS driver IC comprises a low-voltage CMOS driver and a high-voltage CMOS driver.

23. The OPA of claim 20, wherein the CMOS driver IC is bonded to the OPA by flip-chip-bonding.

24. The OPA of claim 20 further comprising an OPA driver circuit, wherein the OPA driver circuit comprises a first metal layer, a second metal layer, a third metal layer, and a plurality of remaining layers, wherein the plurality of remaining layers comprises a circuit area for global routing and bonding.

\* \* \* \* \*